| (12) | United States Patent | (10) Patent No.: | US 12,255,042 B2 |
|---|---|---|---|
| | Huisman et al. | (45) Date of Patent: | Mar. 18, 2025 |

(54) NUMERICALLY COMPENSATING SEM-INDUCED CHARGING USING DIFFUSION-BASED MODEL

(71) Applicant: ASML Netherlands B.V., Veldhoven (NL)

(72) Inventors: Thomas Jarik Huisman, Eindhoven (NL); Shakeeb Bin Hasan, Montreal (CA)

(73) Assignee: ASML Netherlands B.V., Veldhoven (NL)

( * ) Notice: Subject to any disclaimer, the term of this patent is extended or adjusted under 35 U.S.C. 154(b) by 346 days.

(21) Appl. No.: 17/636,344

(22) PCT Filed: Aug. 15, 2020

(86) PCT No.: PCT/EP2020/072941
§ 371 (c)(1),
(2) Date: Feb. 17, 2022

(87) PCT Pub. No.: WO2021/032652
PCT Pub. Date: Feb. 25, 2021

(65) Prior Publication Data

US 2022/0293389 A1    Sep. 15, 2022

(30) Foreign Application Priority Data

Aug. 19, 2019 (EP) .................................... 19192198

(51) Int. Cl.
*H01J 37/28* (2006.01)
*G06T 5/70* (2024.01)
*H01J 37/22* (2006.01)

(52) U.S. Cl.
CPC .............. *H01J 37/222* (2013.01); *G06T 5/70* (2024.01); *H01J 37/28* (2013.01);
(Continued)

(58) Field of Classification Search
None
See application file for complete search history.

(56) References Cited

U.S. PATENT DOCUMENTS 4,556,797 A    12/1985  Kuni et al.
9,909,985 B2    3/2018  Pacholski et al.
(Continued)

FOREIGN PATENT DOCUMENTS

EP    2434453 A2    3/2012
TW    201515046 A    4/2015

OTHER PUBLICATIONS

International Search Report and Written Opinion issued by the International Searching Authority in related International Application No. PCT/EP2020/072941, mailed Jan. 19, 2021 (12 pgs.).
(Continued)

*Primary Examiner* — Eliza W Osenbaugh-Stewart
(74) *Attorney, Agent, or Firm* — Finnegan, Henderson, Farabow, Garrett & Dunner, LLP

(57) ABSTRACT

Systems and methods for image enhancement are disclosed. A method for enhancing an image may include acquiring a scanning electron microscopy (SEM) image. The method may also include simulating diffused charge associated with a position of the SEM image. The method may further include providing an enhanced SEM image based on the SEM image and the diffused charge.

15 Claims, 13 Drawing Sheets

(52) U.S. Cl.
CPC ............... *G06T 2207/10061* (2013.01); *G06T 2207/30148* (2013.01); *H01J 2237/24578* (2013.01)

(56) References Cited

U.S. PATENT DOCUMENTS

| | | |
|---|---|---|
| 2008/0251719 A1 | 10/2008 | Nakahira et al. |
| 2009/0084954 A1* | 4/2009 | Ezumi ................. G01N 23/2251 250/311 |
| 2014/0319341 A1* | 10/2014 | Tanaka ................. H01J 37/222 250/307 |
| 2016/0171727 A1 | 6/2016 | Bouchard et al. |
| 2016/0260576 A1 | 9/2016 | Sears et al. |

OTHER PUBLICATIONS

Office Action issued by the Intellectual Property Office (IPO) in related ROC (Taiwan) Patent Application No. 109127877, mailed Jul. 22, 2021 (13 pgs.).

* cited by examiner

NUMERICALLY COMPENSATING SEM-INDUCED CHARGING USING DIFFUSION-BASED MODEL

CROSS-REFERENCE TO RELATED APPLICATIONS

This application claims priority to International Application No. PCT/EP2020/072941, filed Aug. 15, 2020, and published as WO 2021/032652 A1, which claims priority of EP application Ser. No. 19/192,198.0 which was filed on Aug. 19, 2019. The contents of these applications are incorporated herein by reference in their entireties.

FIELD

The description herein relates to the field of image enhancement, and more particularly to scanning electron microscopy (SEM) image enhancement.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. A SEM can deliver electrons having a certain energy (e.g., 1 keV, 30 keV, etc.) to a surface and record secondary or backscattered electrons leaving the surface using a detector. By recording such electrons for different excitation positions on the surface, an image can be created with a spatial resolution on the order of nanometers.

As the physical sizes of IC components continue to shrink, accuracy, and yield in defect detection become more and more important. However, when inspecting electrically insulating materials, the qualities of the SEM images typically suffer from SEM-induced charging artifacts. In some cases, such charging artifacts may cause a charge-induced critical dimension (CD) error of about 2 nanometers. There are several techniques that can be used to reduce charging artifacts in SEM imaging, such as, for example, coating a target sample surface with a conducting material, optimizing landing energy of an electron beam in a SEM, using faster scanning, such as using a lower dose per SEM frame and using more SEM frames, using opposing scan-directions in a SEM, or using machine learning techniques to remove the SEM charging artifacts numerically, among others. It is noted, however, that those techniques have different disadvantages. Specifically, it is noted that experimental techniques to avoid charging (e.g., pseudo random scans) may be slow and cause low throughput. Machine learning techniques may lack insights into their training processes. Numerical image processing techniques may lack physics-based explainability. Further improvements in the art are desired.

SUMMARY

Embodiments of the present disclosure provide systems and methods for image enhancement. In some embodiments, a method for enhancing an image may include acquiring a scanning electron microscopy (SEM) image. The method may also include simulating diffused charge associated with a position of the SEM image. The method may further include providing an enhanced SEM image based on the SEM image and the diffused charge.

In some embodiments, an inspection system is disclosed. The inspection system may include a memory storing a set of instructions and a processor configured to execute the set of instructions. The process may execute the set of instructions to cause the inspection system to acquire a scanning electron microscopy (SEM) image. The process may also execute the set of instructions to cause the inspection system to simulate diffused charge associated with a position of the SEM image. The process may also execute the set of instructions to cause the inspection system to provide an enhanced SEM image based on the SEM image and the diffused charge.

In some embodiments, a non-transitory computer readable medium is disclosed. The non-transitory computer readable medium may store a set of instructions that is executable by at least one processor of an apparatus to cause the apparatus to perform a method. The method may include acquiring a scanning electron microscopy (SEM) image. The method may also include simulating diffused charge associated with a position of the SEM image. The method may further include providing an enhanced SEM image based on the SEM image and the diffused charge.

BRIEF DESCRIPTION OF THE DRAWINGS

FIGS. 6E-5F are illustrations depicting directional blurring of the charge density mask of FIG. 6D, consistent with some embodiments of the present disclosure.

DETAILED DESCRIPTION

Figure 1:
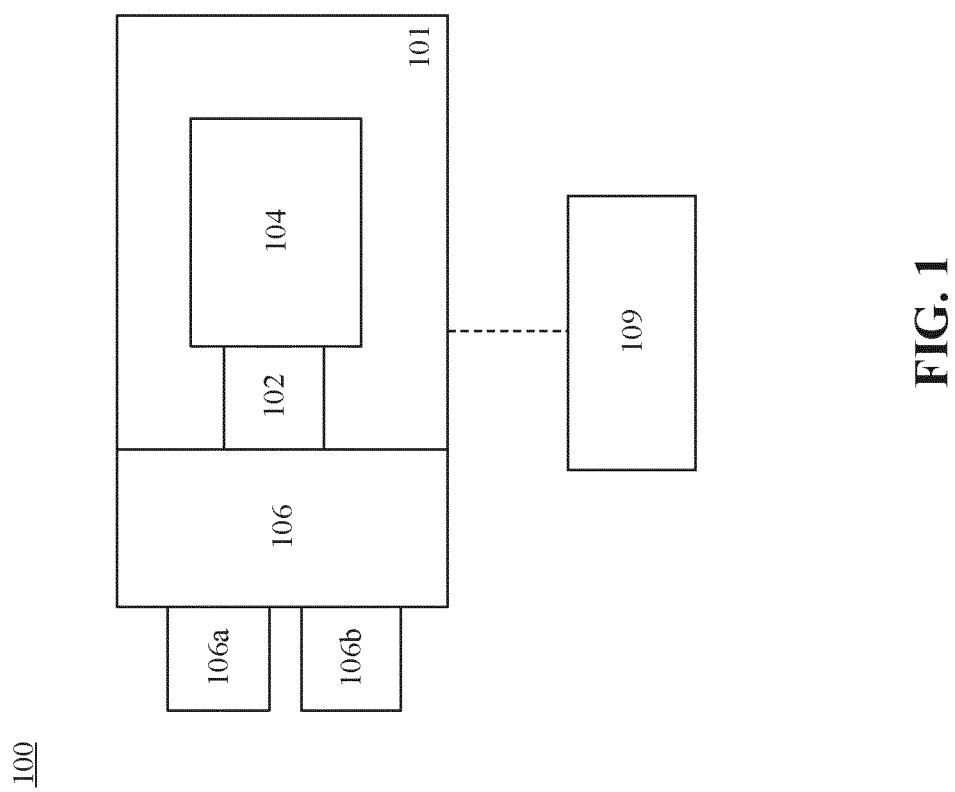
FIG. 1 is a schematic diagram illustrating an exemplary electron beam inspection (EBI) system, consistent with some embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims. For example, although some embodiments are described in the context of utilizing electron beams, the disclosure is not so limited. Other types of charged particle beams may be similarly applied. Furthermore, other imaging systems may be used, such as optical imaging, photodetection, x-ray detection, or the like.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). A SEM can be used to image these extremely small structures, in effect, taking a "picture" of the structures. The working principle of the SEM is similar to a camera. The camera takes a picture by receiving and recording brightness and colors of light reflected or emitted from people or objects. The SEM takes a "picture" by receiving and recording energies of electrons reflected or emitted from the structures. Before taking such a "picture," an electron beam may be provided onto the structures, and when the electrons are reflected or emitted ("exiting") from the structures, a detector of the SEM may receive and record the energies of those electrons to generate an image. The image can be used to determine if the structure was formed properly and also if it was formed in the proper location. If the structure is defective, then the process can be adjusted so the defect is less likely to recur.

However, the errors of the structures indicated by a SEM image may be "real" or may be "false." For example, when the SEM images the structure, distortions may be introduced, causing the structure to appear deformed or misplaced, when, in reality, there are no errors in the formation or placement of the structure. The distortions may be caused by the charges accumulating and changing on the structures of wafer after interacting with the electrons introduced during the scanning phase. Due to the changes of the energies, the SEM may no longer generate the image faithfully representing the structures.

This disclosure describes, among others, methods and systems for reducing SEM-induced charging artifacts. In an example, a SEM image may be adjusted to compensate the changed energies of the electrons received by the detector of the SEM. That is, the energies of the received electrons are not physically corrected, but the characteristics (e.g., pixel values) of the generated image are corrected to reflect the changed energies. Using this compensation technique disclosed herein, the SEM image may be compensated to provide a more faithful representation of the structures.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

FIG. 1 illustrates an exemplary electron beam inspection (EBI) system 100 consistent with some embodiments of the present disclosure. EBI system 100 may be used for imaging. As shown in FIG. 1, EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system.

A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

In some embodiments, controller 109 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 109 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes may include an operating system (OS) and one or more application programs (or "apps") for specific tasks. The memory may also be a virtual memory that includes one or more memories distributed across multiple machines or devices coupled via a network.

Figure 2:
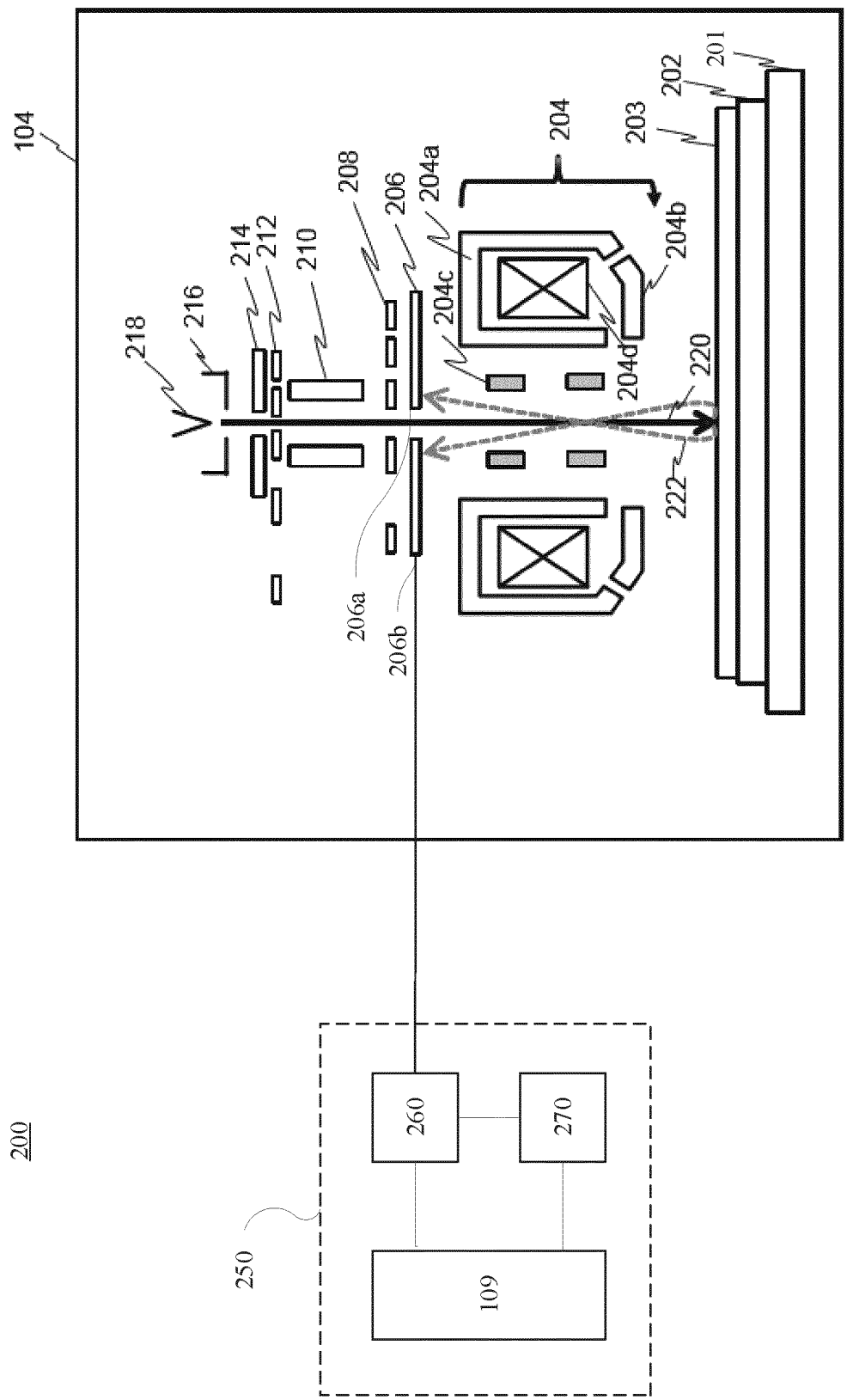
FIG. 2 is a schematic diagram illustrating an exemplary electron beam tool, consistent with some embodiments of the present disclosure that may be a part of the exemplary electron beam inspection system of FIG. 1.

FIG. 2 illustrates an exemplary imaging system 200 according to some embodiments of the present disclosure. Electron beam tool 104 of FIG. 2 may be configured for use in EBI system 100. Electron beam tool 104 may be a single beam apparatus or a multi-beam apparatus. As shown in FIG. 2, electron beam tool 104 includes a motorized sample stage 201, and a wafer holder 202 supported by motorized sample stage 201 to hold a wafer 203 to be inspected. Electron beam tool 104 further includes an objective lens assembly 204, an electron detector 206 (which includes electron sensor surfaces 206a and 206b), an objective aperture 208, a condenser lens 210, a beam limit aperture 212, a gun aperture 214, an anode 216, and a cathode 218. Objective lens assembly 204, in some embodiments, may include a modified swing objective retarding immersion lens (SORIL), which includes a pole piece 204a, a control electrode 204b, a deflector 204c, and an exciting coil 204d. Electron beam tool 104 may additionally include an Energy Dispersive X-ray Spectrometer (EDS) detector (not shown) to characterize the materials on wafer 203.

A primary electron beam 220 is emitted from cathode 218 by applying an acceleration voltage between anode 216 and cathode 218. Primary electron beam 220 passes through gun aperture 214 and beam limit aperture 212, both of which may determine the size of electron beam entering condenser lens 210, which resides below beam limit aperture 212. Condenser lens 210 focuses primary electron beam 220 before the beam enters objective aperture 208 to set the size of the electron beam before entering objective lens assembly 204. Deflector 204c deflects primary electron beam 220 to facilitate beam scanning on the wafer. For example, in a scanning process, deflector 204c may be controlled to deflect primary electron beam 220 sequentially onto different locations of top surface of wafer 203 at different time points, to provide data for image reconstruction for different parts of wafer 203. Moreover, deflector 204c may also be controlled to deflect primary electron beam 220 onto different sides of wafer 203 at a particular location, at different time points, to provide data for stereo image reconstruction of the wafer structure at that location. Further, in some embodiments, anode 216 and cathode 218 may generate multiple primary electron beams 220, and electron beam tool 104 may include a plurality of deflectors 204c to project the multiple primary electron beams 220 to different parts/sides of the wafer at the same time, to provide data for image reconstruction for different parts of wafer 203.

Exciting coil 204d and pole piece 204a generate a magnetic field that begins at one end of pole piece 204a and terminates at the other end of pole piece 204a. A part of wafer 203 being scanned by primary electron beam 220 may be immersed in the magnetic field and may be electrically charged, which, in turn, creates an electric field. The electric field reduces the energy of impinging primary electron beam 220 near the surface of wafer 203 before it collides with wafer 203. Control electrode 204b, being electrically isolated from pole piece 204a, controls an electric field on wafer 203 to prevent micro-arching of wafer 203 and to ensure proper beam focus.

A secondary electron beam 222 may be emitted from the part of wafer 203 upon receiving primary electron beam 220. Secondary electron beam 222 may form a beam spot on sensor surfaces 206a and 206b of electron detector 206. Electron detector 206 may generate a signal (e.g., a voltage, a current, or the like) that represents an intensity of the beam spot, and provide the signal to an image processing system 250. The intensity of secondary electron beam 222, and the resultant beam spot, may vary according to the external or internal structure of wafer 203. Moreover, as discussed above, primary electron beam 220 may be projected onto different locations of the top surface of the wafer or different sides of the wafer at a particular location, to generate secondary electron beams 222 (and the resultant beam spot) of different intensities. Therefore, by mapping the intensities of the beam spots with the locations of wafer 203, the processing system may reconstruct an image that reflects the internal or surface structures of wafer 203.

Imaging system 200 may be used for inspecting a wafer 203 on sample stage 201 and includes an electron beam tool 104, as discussed above. Imaging system 200 may also include an image processing system 250 that includes an image acquirer 260, storage 270, and controller 109. Image acquirer 260 may include one or more processors. For example, image acquirer 260 may include a computer, server, mainframe host, terminals, personal computer, any kind of mobile computing devices, and the like, or a combination thereof. Image acquirer 260 may connect with a detector 206 of electron beam tool 104 through a medium such as an electrical conductor, optical fiber cable, portable storage media, IR, Bluetooth, internet, wireless network, wireless radio, or a combination thereof. Image acquirer 260 may receive a signal from detector 206 and may construct an image. Image acquirer 260 may thus acquire images of wafer 203. Image acquirer 260 may also perform various post-processing functions, such as generating contours, superimposing indicators on an acquired image, and the like. Image acquirer 260 may perform adjustments of brightness and contrast, or the like. of acquired images. Storage 270 may be a storage medium such as a hard disk, cloud storage, random access memory (RAM), other types of computer readable memory, and the like. Storage 270 may be coupled with image acquirer 260 and may be used for saving scanned raw image data as original images, and post-processed images. Image acquirer 260 and storage 270 may be connected to controller 109. In some embodiments, image acquirer 260, storage 270, and controller 109 may be integrated together as one control unit.

In some embodiments, image acquirer 260 may acquire one or more images of a sample based on an imaging signal received from detector 206. An imaging signal may correspond to a scanning operation for conducting charged particle imaging. An acquired image may be a single image including a plurality of imaging areas. The single image may be stored in storage 270. The single image may be an original image that may be divided into a plurality of regions. Each of the regions may include one imaging area containing a feature of wafer 203.

In some embodiments, the SEM image may be an individual SEM image generated by a single scan of primary electron beam 220 on wafer 203 along a single scan-direction. In some embodiments, the SEM image may be a first average SEM image generated by averaging multiple SEM images, each generated by a single scan of primary electron beam 220 on wafer 203 along the same scan-direction. In some embodiments, the SEM image may be a second average SEM image generated by averaging multiple SEM images, each generated by a single scan of primary electron beam 220 on wafer 203 along a different scan-direction. Embodiments of the present disclosure are not limited to any specific SEM image generated by any specific method, and the disclosed methods and systems may enhance SEM images that include, but are not limited to, the examples herein.

A challenge in defect detection is artifacts introduced by the inspection tools (e.g., a SEM). The artifacts do not originate from actual defects of the final products. They may distort or deteriorate the quality of the image to be inspected, and cause difficulties or inaccuracies in defect detection. For example, when inspecting electrically insulating materials using a SEM, the qualities of the SEM images typically suffer from SEM-induced charging artifacts.

Figure 3:
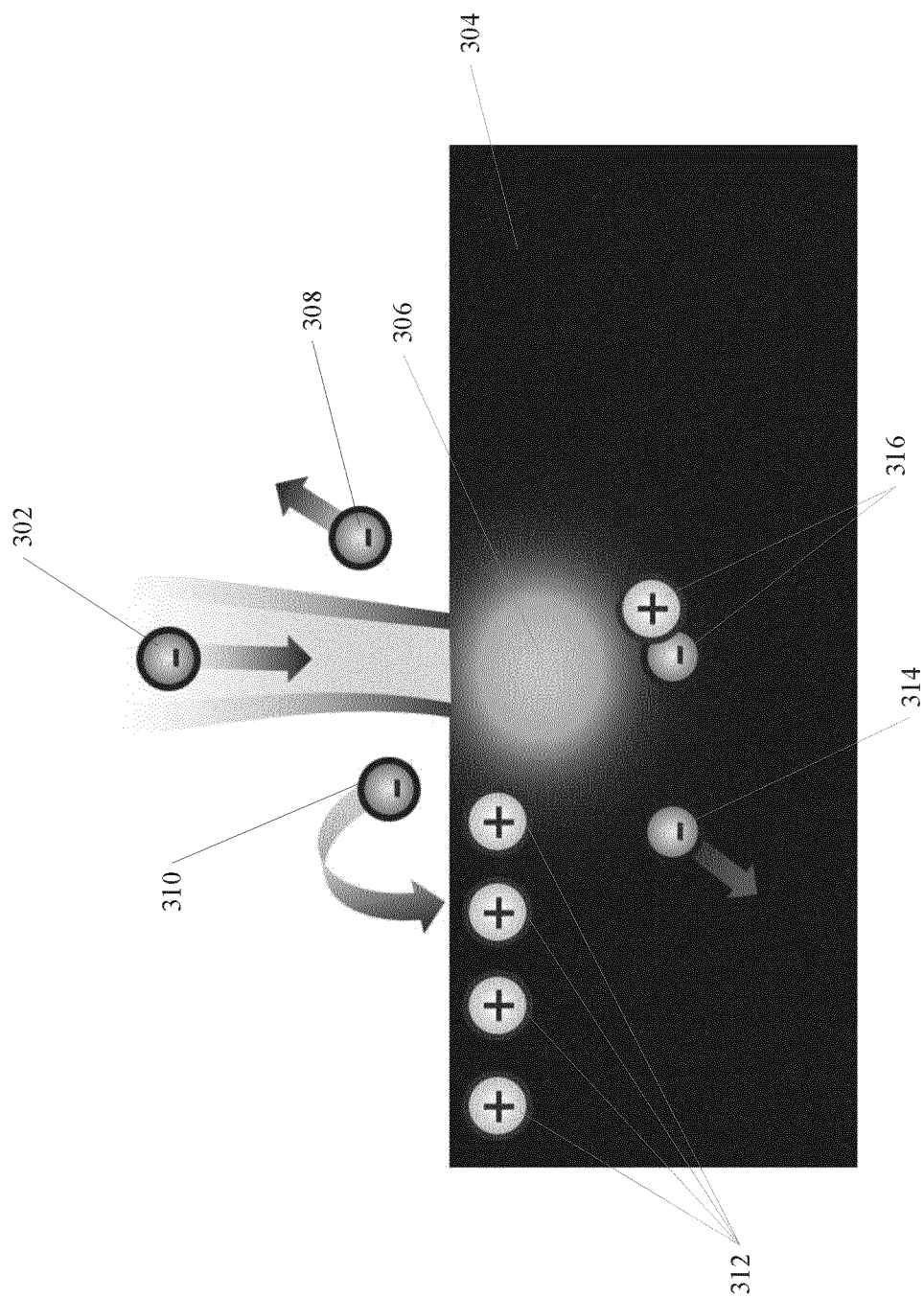
FIG. 3 is an illustration of an example process of SEM-induced charging effect, consistent with some embodiments of the present disclosure.

FIG. 3 is an illustration of an example process of SEM-induced charging effect, consistent with some embodiments of the present disclosure. A SEM generates a primary electron beam (e.g., primary electron beam 220 in FIG. 2) for inspection. In FIG. 3, electrons of primary electron beam 302 are projected onto a surface of insulator sample 304. Insulator sample 304 may be of insulating materials, such as a non-conductive resist, a silicon dioxide layer, or the like. The electrons of primary electron beam 302 may penetrate the surface of insulator sample 304 for a certain depth, interacting with particles of insulator sample 304 in interaction volume 306. Some electrons of primary electron beam 302 may elastically interact with (e.g., in a form of elastic scattering or collision) the particles in interaction volume 306 and may be reflected or recoiled out of the surface of insulator sample 304. An elastic interaction conserves the total kinetic energies of the bodies (e.g., electrons of primary electron beam 302 and particles of insulator sample 304) of the interaction, in which no kinetic energy of the interacting bodies does not convert to other forms of energy (e.g., heat, electromagnetic energy, etc.). Such reflected electrons generated from elastic interaction may be referred to as backscattered electrons (BSEs), such as BSE 308 in FIG. 3. Some electrons of primary electron beam 302 may inelastically interact with (e.g., in a form of inelastic scattering or collision) the particles in interaction volume 306. An inelastic interaction does not conserve the total kinetic energies of the bodies of the interaction, in which some or all of the kinetic energy of the interacting bodies covert to other forms of energy. For example, through the inelastic interaction, the kinetic energy of some electrons of primary electron beam 302 may cause electron excitation and transition of atoms of the particles. Such inelastic interaction may also generate electrons exiting the surface of insulator sample 304, which may be referred to as secondary electrons (SEs), such as SE 310 in FIG. 3. Yield or emission rates of BSEs and SEs depend on, e.g., the energy of the electrons of primary electron beam 302 and the material under inspection, among others. The energy of the electrons of primary electron beam 302 may be imparted in part by its acceleration voltage (e.g., the acceleration voltage between anode 216 and cathode 218 in FIG. 2). The quantity of BSEs and SEs may be more or fewer (or even the same) than the injected electrons of primary electron beam 302. An imbalance of incoming and outgoing electrons can cause accumulation of electric charge (e.g., positive or negative charge) on the surface of insulator sample 304. Because insulator sample 304 is non-conductive and cannot be grounded, the extra charge may build up locally on or near the surface of insulator sample 304, which may be referred to as a SEM-induced charging effect.

Typically, insulating materials (e g, many types of resists) may be positively charged, because the outgoing electrons (e.g., BSEs or SEs) typically exceeds the incoming electrons of the primary electron beam of a SEM, and extra positive charge builds up on or near the surface of the insulator material. FIG. 3 shows a case where the SEM-induced charging effect occurs and causes positive charge accumulated on the surface of insulator sample 304. The positive charge may be physically modelled as holes 312. In FIG. 3, the electrons of primary electron beam 302 injected into interaction volume 306 may diffuse to the neighboring volume of interaction volume 306, which may be referred to as diffused electrons, such as diffused charge 314. The diffused electrons may recombine with positive charge (e.g., holes) in insulator sample 304, such as recombination pair 316. The diffusion and recombination of charge may affect the distribution of holes 312. Holes 312 may cause a problem by, e.g., attracting BSEs and SEs back to the surface of insulator sample 304, increasing the landing energy of the electrons of primary electron beam 302, causing the electrons of primary electron beam 302 to deviate from their intended landing spot, or interfering with an electric field between the surface of insulator sample 304 and an electron detector of BSEs and SEs, such as electron detector 206 in FIG. 2.

The SEM-induced charging effect may attenuate and distort the SEM signals received by the electron detector, which may further distort generated SEM images. Also, because insulator sample 304 is non-conductive, as primary electron beam 302 scans across its surface, positive charge may be accumulated along the path of primary electron beam 302. Such accumulation of positive charge may increase or complicate the distortion in the generated SEM images. Such distortion caused by the SEM-induced charging effect may be referred to as SEM-induced charging artifacts. The SEM-induced charging artifacts may induce error in estimating geometrical size of fabricated structures or cause misidentification of defects in an inspection.

In one aspect of some embodiments of the present disclosure, a modeling technique is disclosed to simulate the SEM-induced charging effect. The model is based on physics theory of charge diffusion and may analytically or phenomenologically describe charge diffusion (e.g., positive charge diffusion) in the sample generated by the injected electrons from the primary electron beam. Further, the SEM image and the sought compensated SEM image is assumed to be related by a compensation relationship. The compensation relationship is developed based on physics theories of electron-hole recombination or Coulomb interaction, among others. Based on the diffusion-based model and the compensation relationship, a distorted SEM image may be numerically compensated. To reduce computation cost, the diffusion-based model and the compensation relationship utilize a parameterization approach to introduce parameters for simulating the primary physics effect of the charging without tedious calculation of secondary details or time-consuming simulations (e.g., Monte-Carlo simulations). For optimizing the compensation results, the parameters used in the diffusion-based model and the compensation relationship are tunable and may be calibrated to theoretical calculations, experimental benchmarks, or pragmatic key performance indicators (KPIs). Because such an approach uses analytical description based on physics theories, it may significantly reduce computation cost. It may also provide simple and intuitive explanations to the image processing process, offer high throughput for compensating SEM images with charging artifacts, and reinforce the confidence of the compensation results.

A surface of an insulating material sample may include various features, such as lines, slots, corners, edges, holes, or the like. Those features may be at different heights. When the primary electron beam scans across a feature that has a height change, especially a sudden height change, SEs may be generated and collected from the surface, and additionally from an edge or even a hidden surface (e.g., a sidewall of the edge) of the feature. Those additional SEs may cause brighter edges or contours in the SEM image. Such an effect may be referred to as "edge enhancement" or "edge bloom." The SEM-induced charging effect may also be aggravated due to the escape of the additional SEs (i.e., leaving additional positive charge on the sample surface). The aggravated charging effect may cause different charging artifacts in edge bloom regions of the SEM image, depending on whether the height of the surface elevates or lowers as the primary electron beam scans by. Therefore, in some implementations, determining edges (or edge blooms) in an SEM image may be performed as one step of the compensation process.

Figure 5B:
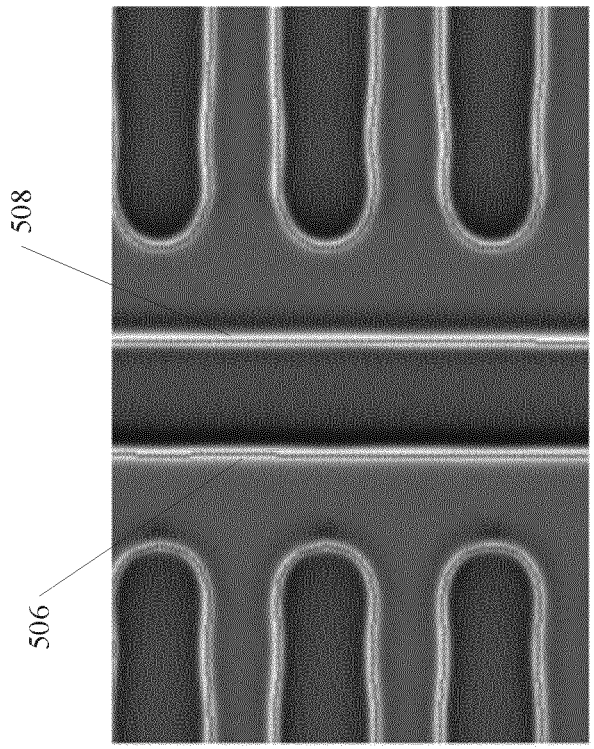
FIG. 5B is an illustration of patterns of a second exemplary SEM image having SEM-induced artifacts, consistent with some embodiments of the present disclosure.
Figure 5A:
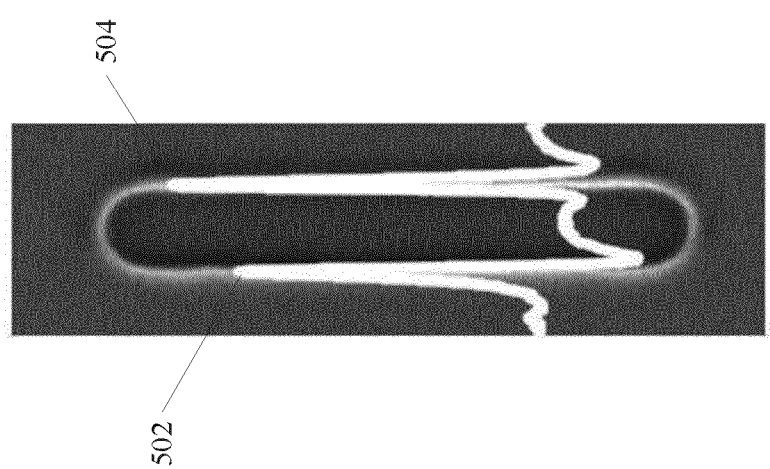
FIG. 5A is an illustration of a pattern of a first exemplary SEM image overlaid with a SEM signal waveform, consistent with some embodiments of the present disclosure.
Figure 5D:
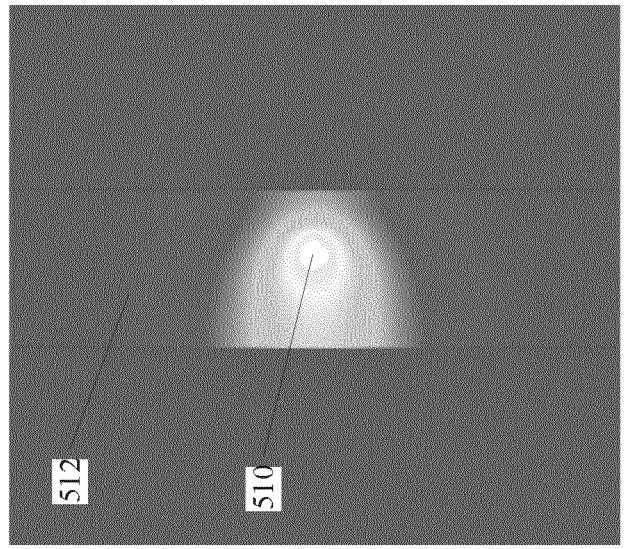
FIGS. 5C-5D show an illustration of an example distribution of diffused charge density generated by a primary electron beam scanning across a linear feature, consistent with some embodiments of the present disclosure.
Figure 5C:
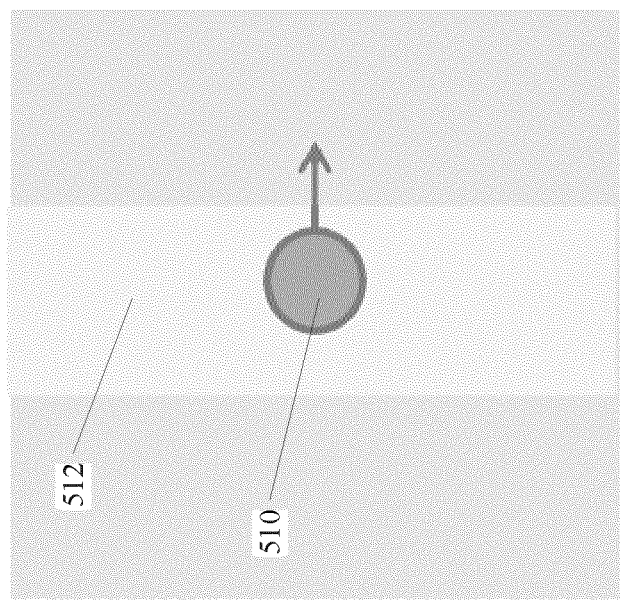
Figure 5E:
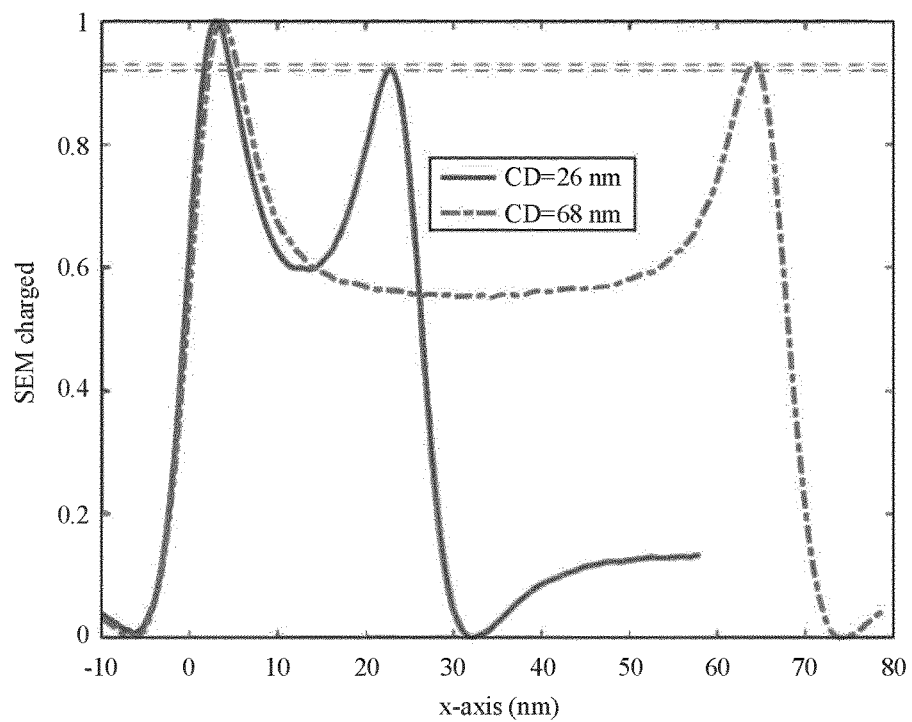
FIG. 5E is an illustration of SEM waveforms of two line-space patterns showing SEM-induced artifacts without compensation, consistent with some embodiments of the present disclosure.
Figure 5F:
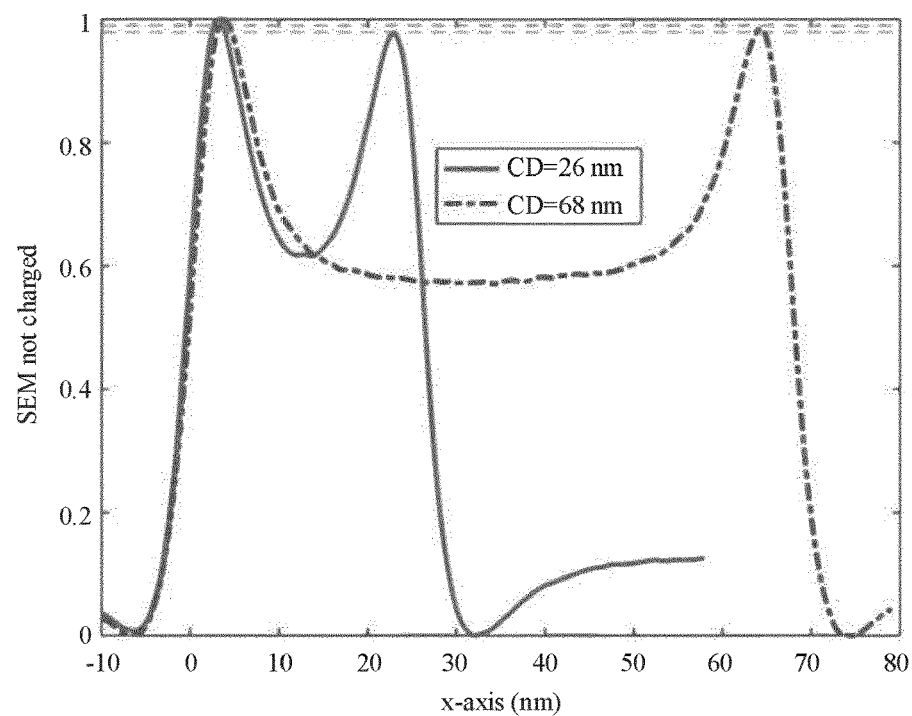
FIG. 5F is an illustration of the SEM waveforms of the two line-space patterns in FIG. 5E after charge compensation, consistent with some embodiments of the present disclosure.

Further, in some embodiments, when the inspection tool performs a one-dimensional SEM scan, the inspection tool may compensate a SEM image having a line-space feature (such as slots or lines shown in FIGS. 5A and 5B) such that SEM signal amplitudes (e.g., represented by waveforms) may become symmetric at edges of the line-space feature (such as shown in FIG. 5F). In some embodiments, when the inspection tool performs a two-dimensional SEM scan (e.g., in a raster manner), the inspection tool may compensate a SEM image having a two-dimensional curved features (such as curvature shown in FIG. 6A) such that charging-induced asymmetry of image brightness may be corrected (such as shown in FIG. 6G), and SEM signal amplitudes of different portions of the curvature may become more uniform or symmetric (such as shown in FIG. 6I).

Figure 4:
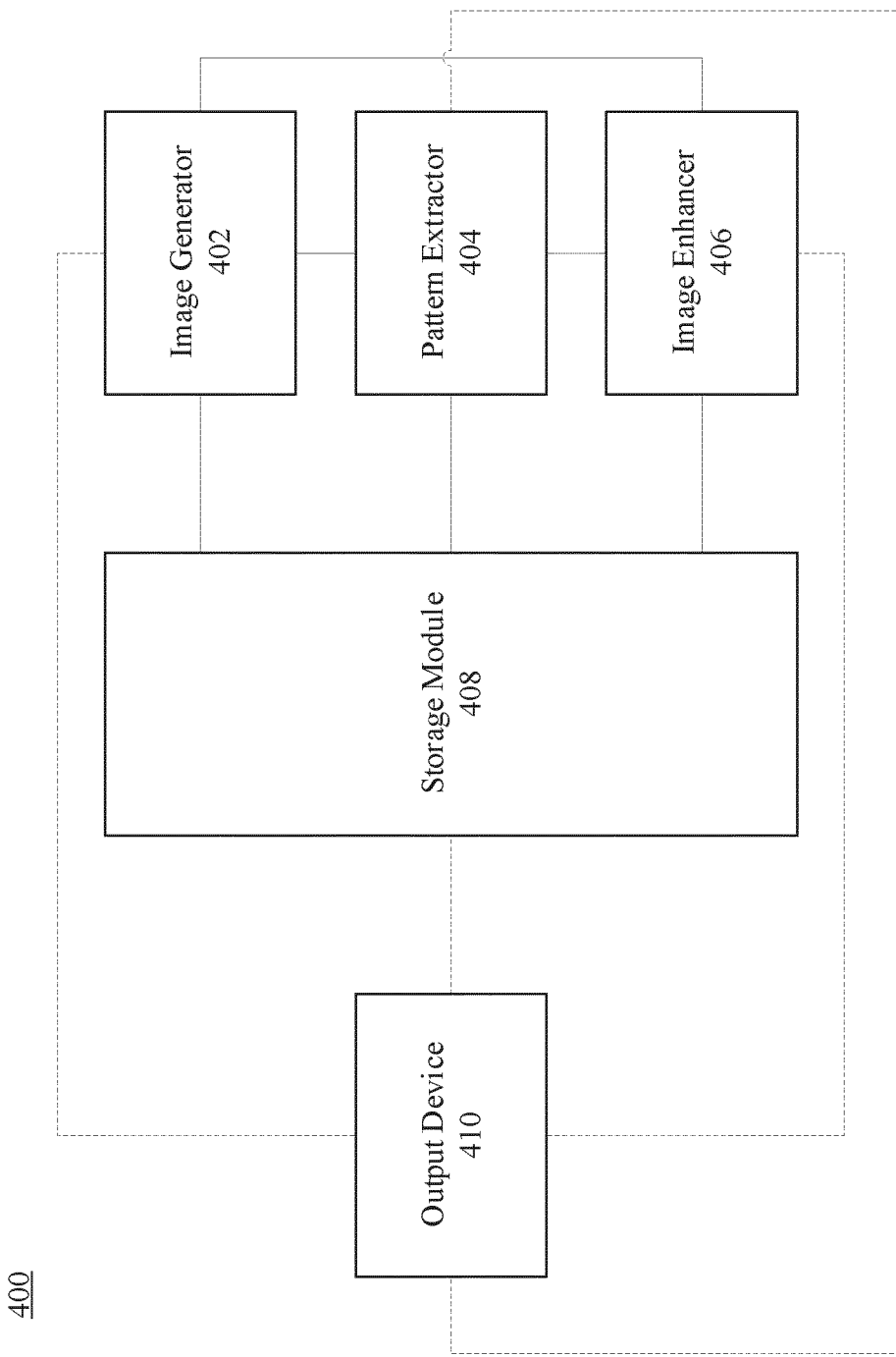
FIG. 4 is a schematic diagram of an exemplary image enhancement system 400, consistent with some embodiments of the present disclosure.

FIG. 4 is a schematic diagram of an exemplary image enhancement system 400, consistent with some embodiments of the present disclosure. In some embodiments, image enhancement system 400 may be part of image processing system 250 of FIG. 2. In some embodiments, image processing system 250 may be part of image enhancement system 400. Image enhancement system 400 may include an image generator 402, a pattern extractor 404, an image enhancer 406, and a storage module 408. In some embodiments, optionally, image enhancement system 400 may further include output device 410. Each of image generator 402, pattern extractor 404, and image enhancer 406 may include hardware modules, software modules, or a combination thereof. For example, the hardware modules may include input/output (I/O) interfaces for receiving and sending data. For another example, the software modules may include computer-readable program code or instructions for implementing an algorithm.

In some embodiments, image generator 402 may be part of image acquirer 260 of imaging system 200 in FIG. 2. Image generator 402 may acquire inspection images of a surface of a sample, such as wafer 203. In some embodiments, wafer 203 may be a semiconductor wafer substrate, a semiconductor wafer substrate having one or more epi-layers or process films, or a semiconductor wafer substrate having a coated resist layer. The inspection image may include a feature of the sample, a region of interest on the sample, or the entire sample. In some embodiments, the inspection images may be SEM images acquired using a SEM, for example.

In some embodiments, pattern extractor 404 may be implemented as a signal processing algorithm, an image processing algorithm, or the like. Pattern extractor 404 may be integrated into image acquirer 260. In some embodiments, pattern extractor 404 may operate as a separate, stand-alone unit configured to process inspection images. In some embodiments, pattern extractor 404 may include an image processing unit (not shown) configured to adjust brightness, contrast, saturation, flatness, noise filtering, or the like of inspection images before storage. In some embodiments, pattern extractor 404 may extract pattern information from pre-stored inspection images.

In some embodiments, pattern extractor 404 may include a feature extraction algorithm to extract relevant pattern information from inspection images. The extracted relevant pattern information may include global information (e.g., global structural features, global patterns, reference fiducials, or the like) or local information (e.g., local structural features or local patterns or the like). The extracted relevant pattern information may be stored in storage module 408, which may be configured to be accessed by other components of image enhancement system 400.

In some embodiments, image enhancement system 400 may include image enhancer 406. Image enhancer 406 may generate an enhanced inspection image based on the inspection image generated by image generator 402, or the pattern or feature information extracted by pattern extractor 404. By applying the diffusion-based model and the compensation relationship on the inspection image and the pattern or feature information, image enhancer 406 may output the enhanced inspection image. In some embodiments, image enhancer 406 may be implemented as a software module, an algorithm, or the like.

In some embodiments, image enhancement system 400 may include storage module 408. In some embodiments, storage module 408 may be part of storage 270 of imaging system 200 in FIG. 2. In some embodiments, storage module 408 may be an integrated storage medium of image enhancement system 400, configured to connect with each of the components thereof. Storage module 408 may be a remote storage module accessible through wired or wireless communications over the Internet, a cloud platform, or suitable Wi-fi communication pathways, among others.

Storage module 408 may store inspection images from image generator 402, extracted pattern or feature information from pattern extractor 404, enhanced inspection images from image enhancer 406, or the like. Storage module 408 may also share stored information with the other components (not shown) of image enhancement system 400.

In some embodiments, optionally, image enhancement system 400 may further include output device 410. In some embodiments, output device 410 may be integrally connected with EBI system 100, integrated within electron beam tool 104, or be a separate output device located in a remote location. For example, output device 410 may be remotely located and operated through a wired or wireless communication network (e.g., Wi-fi, internet, or a cloud network) or other suitable communication networks or platforms. In some embodiments, output device 410 may be a handheld output device, a wearable output device, a multi-screen display, an interactive output device, or any other suitable output device.

Output device 410 may display the inspection images from image generator 402, the pattern or feature information from pattern extractor 404, the enhanced image from image enhancer 406, or the like. In some embodiments, output device 410 may also be connected with storage module 408 to display stored information of a sample or a region of interest on the wafer. In some embodiments, output device 410 may display pre-processed and post-processed images of a wafer, regions of interest, or features on the wafer. Output device 410 may also be used to display real-time pre-processing, SEM images.

FIG. 5A is an illustration of a pattern of a first exemplary 2D SEM image overlaid with a 1D SEM signal waveform, consistent with some embodiments of the present disclosure. For example, the pattern in FIG. 5A may be a slot from which a 1D waveform can be acquired by scanning a line from left to right in the middle of the slot. In FIG. 5A, the primary electron beam scans from left to right. The SEM signal waveform may represent SEM signal amplitudes or strengths generated when the primary electron beam scans across two linear features (e.g., contours) of the pattern, with the height of the overlaying waveform representing the amplitudes. The two linear features in the SEM image may represent first edge 502 and second edge 504 of the pattern. First edge 502 and second edge 504 should have generated substantially symmetric SEM signals due to their symmetric structure. However, as shown in FIG. 5A, the SEM waveform amplitudes at the first and second edges 502 and 504 are not the same (i.e., "asymmetric"). When the primary electron beam scans from outside the slot to inside the slot (i.e., the height of the sample surface lowers), the generated SEM signal amplitude is smaller than that when the primary electron beam scans from inside the slot to outside the slot (i.e., the height of the sample surface elevates). Such SEM signal asymmetry may be ascribed to SEM-induced charging effect, and FIG. 5A shows an example one-dimensional charging artifact (e.g., along the scanning direction of the primary electron beam).

FIG. 5B is an illustration of patterns of a second exemplary SEM image having SEM-induced artifacts, consistent with some embodiments of the present disclosure. In FIG. 5B, first edge 506 and second edge 508 of a slot also show asymmetric brightness features due to SEM-induced charging effect: at first edge 506, the outside of the slot is brighter than the inside of the slot, however, at second edge 508, the inside of the slot is brighter than the outside of the slot. For tip-to-line CD measurements in the second exemplary SEM image, the charging artifacts may contribute a measurement uncertainty in the order of 2 nanometers in some cases.

FIGS. 5C-5D show an illustration of an example distribution of diffused charge density generated by a primary electron beam scanning across a linear feature, consistent with some embodiments of the present disclosure. In some embodiments, the diffused charge may be positive charge. In FIG. 5C, primary electron beam 510 (shown as a beam spot in a top view) scans across linear feature 512 (e.g., a line-space pattern) from left to right. FIG. 5D shows a corresponding charge density distribution at a particular instance of time within linear feature 512. For example, if primary electron beam 510 causes a charging effect that accumulates positive charge, the charge density distribution may be the hole density distribution on a surface of linear feature 512. In FIG. 5D, white color represents the instantaneous density of the charge. The lighter the color is, the higher the density is. In FIG. 5D, the position under the beam spot has the highest charge density, and as primary electron beam 510 scans across linear feature 512, the charge diffuses and expands from the scan path of primary electron beam 510. As shown in FIG. 5D, primary electron beam 510 may cause charging effect in front of the current illuminating position. However, the portion of linear feature 512 behind the moving beam spot has larger charge diffusion than the portion of linear feature 512 ahead of the beam spot.

FIG. 5E is an illustration of SEM waveforms of two line-space patterns showing SEM-induced artifacts without compensation, consistent with some embodiments of the present disclosure. The two line-space patterns (respectively shown as a solid curve and a dashed curve) may be generated from scanning linear features similar to FIGS. 5A and 5B on a surface of a resist, for example. The two line-space patterns have different CDs (e.g., line widths), represented by distances between two peaks of each curve. In FIGS. 5E and 5F, the two CDs are 26 nanometers and 68 nanometers, respectively. Without compensation, the SEM signals are asymmetric (i.e., their peaks have different heights), showing the charging artifacts.

FIG. 5F is an illustration of the SEM waveforms of the two line-space patterns in FIG. 5E after charge compensation, consistent with some embodiments of the present disclosure. After charge compensation (or "decharging") performed by image enhancer 406, the SEM waveforms of the two line-space patterns show more substantial symmetry, showing great reduction of the charging artifacts.

Figure 6A:
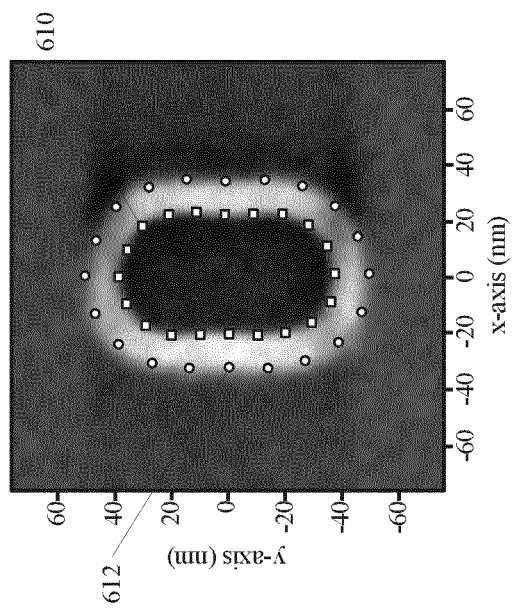
FIG. 6A is an illustration of a pattern of a third exemplary SEM image having a curved feature, consistent with some embodiments of the present disclosure.

FIG. 6A is an illustration of a pattern of a third exemplary SEM image having a curved feature, consistent with some embodiments of the present disclosure. For example, the pattern may be a hole. In FIG. 6A, the primary electron beam scans from left to right. At regions 602-608, the SEM should have generated symmetric SEM signals due to their symmetric structure with respect to the center of the hole. However, regions 602-608 shows asymmetry of brightness for inside and outside the hole. Such SEM signal asymmetry may be ascribed to SEM-induced charging, and FIG. 6A shows an example two-dimensional charging artifact.

Figure 6B:
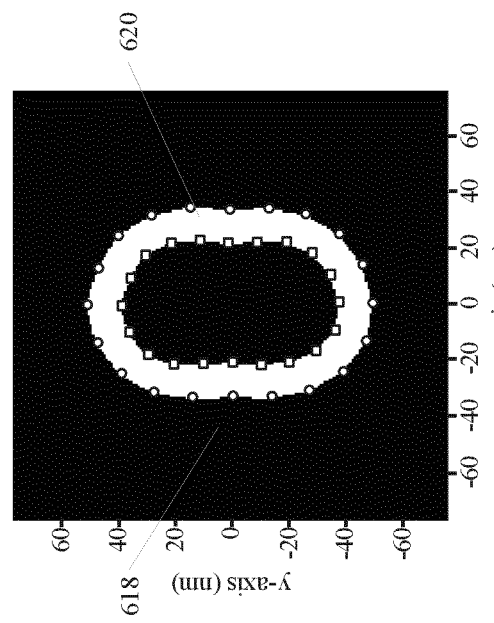
FIG. 6B is an illustration depicting contour identification of the pattern of FIG. 6A, consistent with some embodiments of the present disclosure.

FIG. 6B is an illustration depicting contour identification of the pattern of FIG. 6A, consistent with some embodiments of the present disclosure. As previously described, in some embodiments, contour identification may be performed to compensate for the changes of the charging effects due to height changes at edges of the sample surface. In FIG. 6B, an inner contour (represented by square dots 610) may be identified around a dark area. The dark area may have a blurred boundary. The accuracy of the inner contour identification can tolerate uncertainty up to a certain level without significantly affecting the result of charging artifact compensation to the SEM image. Details of the inner contour identification will be described in FIGS. 7-9.

The identified contours indicate locations of edge blooms (i.e., regions with additional positive charge). Edge blooms may indicate regions with aggravated SEM-induced charging artifacts. In some embodiments, an extrapolation approach may be used to identify edge-blooming regions, in which an edge-blooming region may be determined as a region enclosed by the inner contour and an outer contour extrapolated outward by a predetermined distance from the inner contour. In some embodiments, the predetermined distance may be a few nanometers (e.g., 8, 10, 12 nanometers, or any distance within the order of several or tens of nanometers). The outer contour is shown as round dots 612 in FIG. 6B. It should be noted that other approaches to determine the edge-blooming regions may also be used, such as an automatic approach, and the disclosed techniques are not limited to the extrapolation approach, whereby both inner and outer contours may be detected through thresholding the intensity of the SEM signal.

Figure 6C:
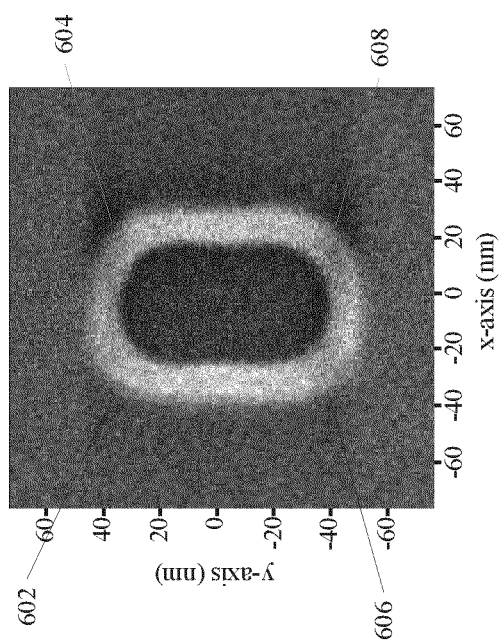
FIG. 6C is an illustration depicting height mask determination based on the identified contours of FIG. 6B, consistent with some embodiments of the present disclosure.

FIG. 6C is an illustration depicting height mask determination based on the identified contours of FIG. 6B, consistent with some embodiments of the present disclosure. A height mask is a mapping that distinguishes area inside and outside the hole in the SEM image at the height of a horizontal slice plane parallel with the sample surface (referred to as a "horizontal cross-section"). For example, for the curved feature, as shown in FIG. 6A, assuming the bottom (i.e., the lowest point) of the curved feature is at height 0 and the apex of the curved feature is the maximum height, one or more (e.g., 1, 2, 3, 4, or any positive integer) horizontal cross-sections may be inserted between the height 0 and the maximum height to determine the mapping. Because the vertical profile of the curved feature has variations (e.g., an inner wall of the hole is not upright but slanted) in three-dimensional space, horizontal cross-sections at different heights may result in determining different mappings that distinguish the "inside" and "outside" of the hole.

In some embodiments, the height mask may be binary. For example, the pixels defined as inside the hole by the mapping may be assigned with a first weight (e.g., 0), and the pixels defined as outside the hole or on the edge of the hole may be assigned with a second weight (e.g., 1), or vice versa. Pixels 616 having the first weight may be displayed as black (such as by output device 410), and pixels 614 having the second weight may be displayed as white (such as by output device 410), or vice versa. For example, FIG. 6C shows a mapping at the maximum height, as indicated by the pixels 614 between the inner contour and outer contour being white, as well as pixels outside the outer contour. In some embodiments, the height mask may be ternary, quaternary, or with any number of levels of weight values assigned to the mapping.

The reason for determining the height mask is that the charging of the SEM image may appear differently as the area inside (or outside) the hole is different. For simulating such different charging, the parameters used in the diffusion-based model or the compensation relationship as previously described may be assigned with different ranges as the area inside (or outside) the hole is different. Because the vertical profile of holes is not ideal in reality, it may be challenging to determine a clear boundary between the "inside" and "outside" of the hole. In other words, such a boundary depends on which height the horizontal cross-section sits on (e.g., at which height the height mask is determined). As a result, the result of the charging artifact compensation may depend on where the boundary sits. In some embodiments, only one height mask may be used in the compensation calculation. In some embodiments, multiple height masks may be used, in which the compensation calculations may be repeated for each of the height masks (e.g., setting different ranges of the parameters for each of the height masks). The more height masks are used, the more likely a nearer-to-optimal enhanced SEM image may be found. However, using more height masks may also drive up computation costs. The number of the height masks to be used may depend on a balance between available computation resources, computation costs, and accuracy demand for the enhanced SEM images, and is not limited in the present disclosure.

Figure 6D:
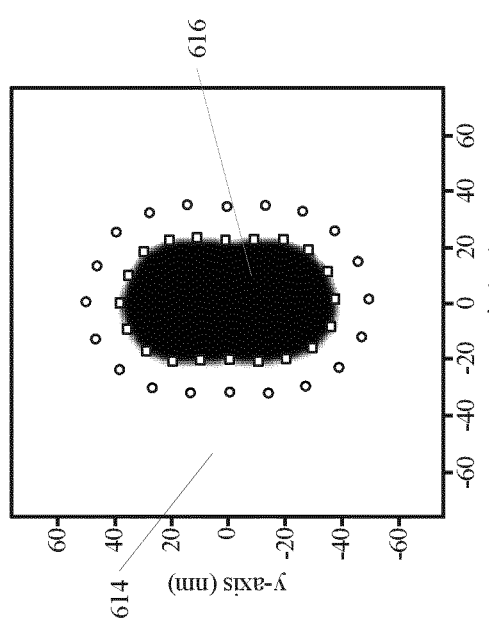
FIG. 6D is an illustration depicting charge density mask determination based on the identified contours of FIG. 6B, consistent with some embodiments of the present disclosure.

FIG. 6D is an illustration depicting charge density mask determination based on the identified contours of FIG. 6B, consistent with some embodiments of the present disclosure. A charge density mask is a mapping that indicates areas having an increased generation of positive charge. The areas having the increased generation of positive charge are the regions affected by the SEM-induced charging effect (e.g., areas where SEM signals would be attenuated), and may be the primary regions of charging artifact compensation.

The charge density mask may be used to generate the diffusion of charge otherwise obtained through a two-dimensional diffusion-based model. In some embodiments, the charge density mask may indicate areas having edge blooms. In some embodiments, the charge density mask may have different forms for inside and outside of a hole. For example, the charge density mask for areas inside the hole (e.g., described by the height mask) may be determined in a non-analytic form (e.g., a uniform form), and the charge density mask for areas outside the hole may be determined in an analytic form. In some embodiments, the charge density mask may be binary. For example, the pixels in the edge bloom areas may be assigned with a first weight (e.g., 1), and the pixels outside the edge bloom areas and on the edge of the edge bloom areas may be assigned with a second weight (e.g., 0), or vice versa. Pixels 620 having the first weight may be displayed as white (such as by output device 410), and pixels 618 having the second weight may be displayed as black (such as by output device 410), or vice versa. For example, FIG. 6D shows a charge density mask representing the edge bloom areas (e.g., determined in FIG. 6B) outside the hole. In some embodiments, the charge density mask may be ternary, quaternary, or with any number of levels of weight values assigned to the pixels.

Figure 6F:
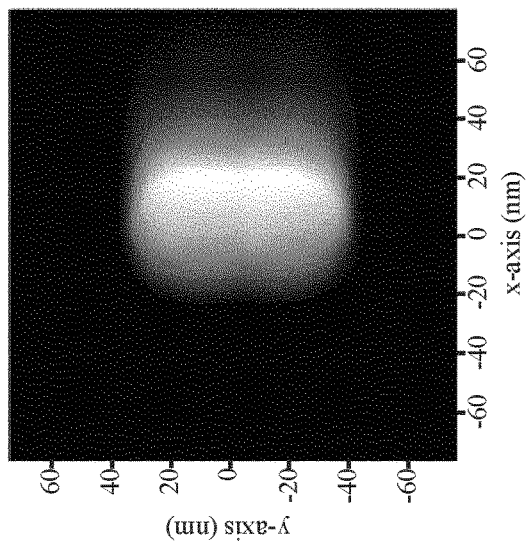
Figure 6E:
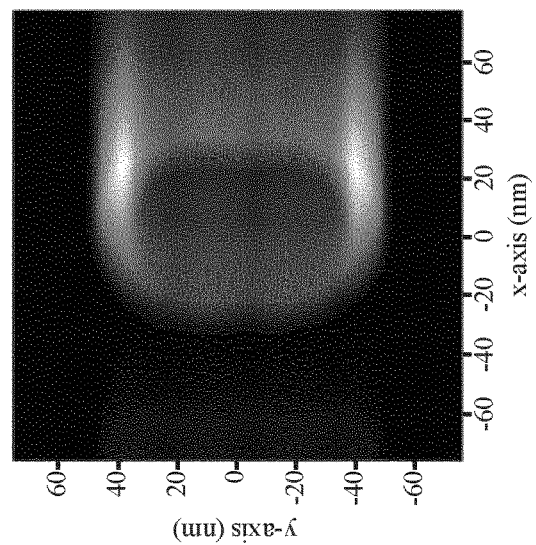
Figure 6G:
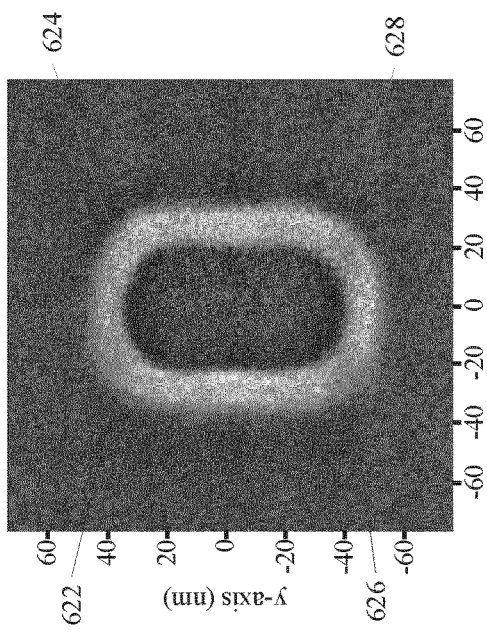
FIG. 6G is an illustration of the pattern of the third exemplary SEM image after charging artifact compensation, consistent with some embodiments of the present disclosure.
Figure 6I:
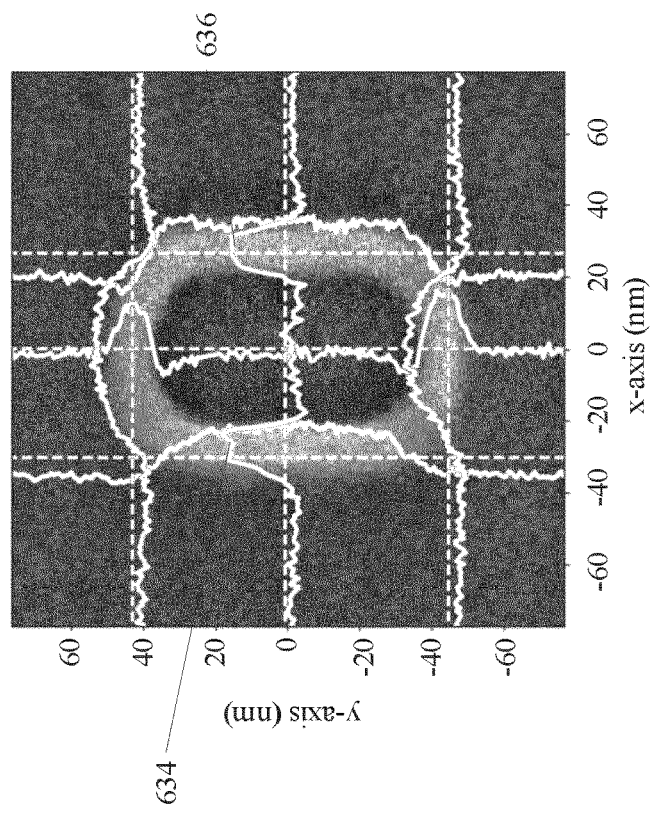
FIG. 6I is an illustration of the SEM waveforms overlying on top of the pattern of the third exemplary SEM image with compensation, consistent with some embodiments of the present disclosure.

FIGS. 6E and 6F are illustrations depicting directional blurring of the charge density mask of FIG. 6D at different heights as indicated by FIG. 6C, respectively, consistent with some embodiments of the present disclosure. Because the scanning of the primary electron beam is directional, earlier-scanned areas may have a residual charging effect (e.g., by built-up charge) that interferes with later-scanned areas, and that interference is directional. The charge density mask may be directionally blurred to simulate such interferences. In some embodiments, the directional blurring may be implemented by convoluting the charge density mask with a directional decaying or decreasing function, such as a Gaussian function or Lorentzian function. For example, the directional Gaussian function or Lorentzian function may be non-zero only for predetermined values of the independent variables of the function. Details of the directional Gaussian function or Lorentzian function will be described in FIGS. 7-9. For example, FIG. 6E shows a blurred charge density mask of FIG. 6D (i.e., the charge density mask outside the hole or at a higher height as indicated by FIG. 6C). FIG. 6F shows a blurred charge density mask inside the hole or at a lower height as indicated by FIG. 6C. The white areas in FIGS. 6E-6F shows areas having charging effect, and the brightness of the white color indicate the intensity of the charging effect.

FIG. 6G is an illustration of the pattern of the third exemplary SEM image after charging artifact compensation, consistent with some embodiments of the present disclosure. The compensation may be performed using the diffusion-based model and the compensation relationship, which will be described in FIGS. 7-9. Comparing FIG. 6G with FIG. 6A, it can be shown that the charging artifacts are significantly reduced or eliminated, such as in regions 622-628.

Figure 6H:
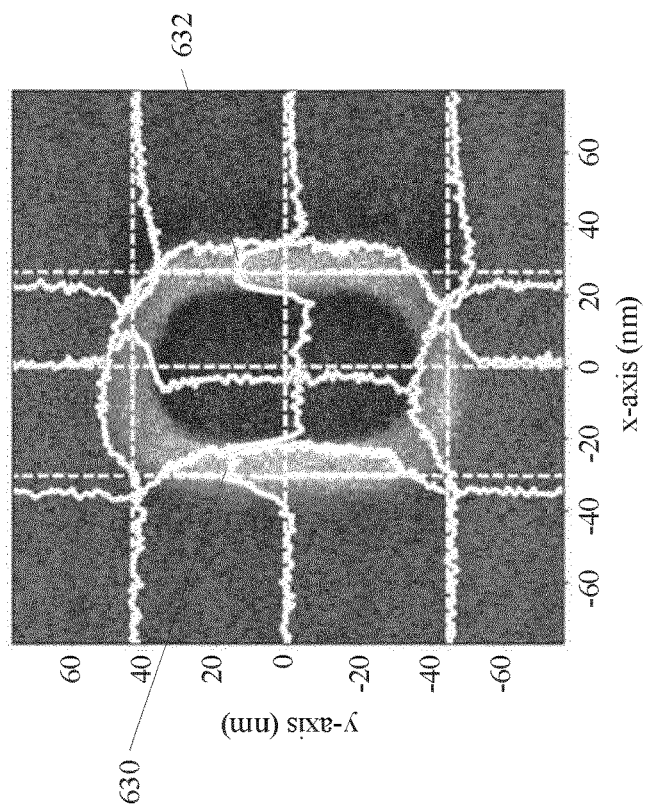
FIG. 6H is an illustration of SEM waveforms overlying on top of the pattern of the third exemplary SEM image without compensation, consistent with some embodiments of the present disclosure.

FIG. 6H is an illustration of SEM waveforms overlying on top of the pattern of the third exemplary SEM image without compensation, consistent with some embodiments of the present disclosure. FIG. 6H shows SEM signal amplitudes of the overlaid areas of the third exemplary SEM image. As shown in FIG. 6H, the SEM waveforms are asymmetric on regions having symmetric features. For example, SEM signal peaks 630 and 632 are asymmetric (i.e., having different amplitudes), while the regions corresponding to SEM signal peaks 630 and 632 are symmetric with respect to the center of the pattern. Also, the baselines between SEM signal peaks 630 and 632 are not flat. Those show the SEM-induced charging artifacts.

FIG. 6I is an illustration of the SEM waveforms overlying on top of the pattern of the third exemplary SEM image with compensation, consistent with some embodiments of the present disclosure. FIG. 6I shows SEM signal amplitudes of the overlaid areas of the third exemplary SEM image. After charge compensation (or "decharging") performed by image enhancer 406, the SEM waveforms as shown in FIG. 6H, become substantially symmetric, showing significant reduction of the charging artifacts. For example, SEM signal peaks 634 and 636 become substantially symmetric after performing compensation, compared with SEM signal peaks 630 and 632.

Figure 7:
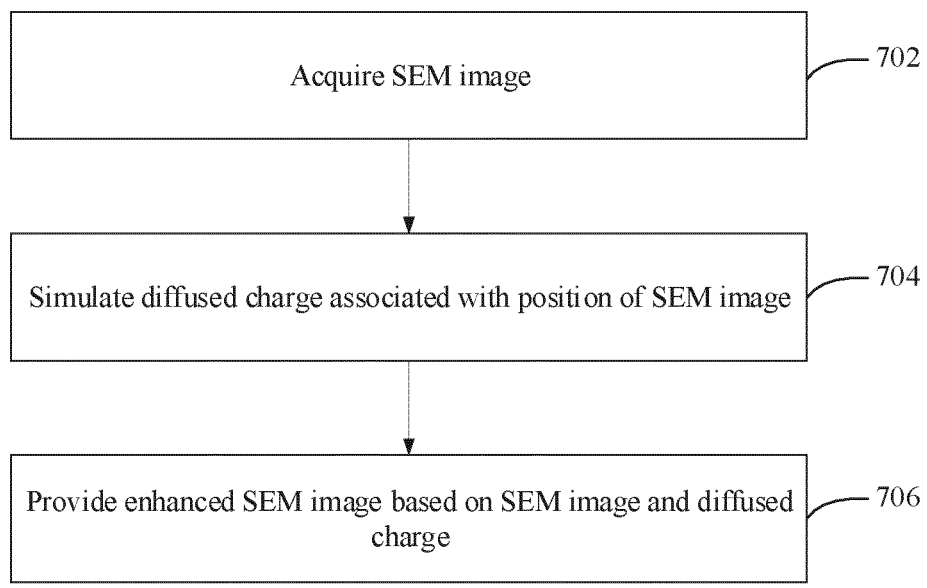
FIG. 7 is a flowchart illustrating an exemplary image enhancement method, consistent with some embodiments of the present disclosure.
Figure 8:
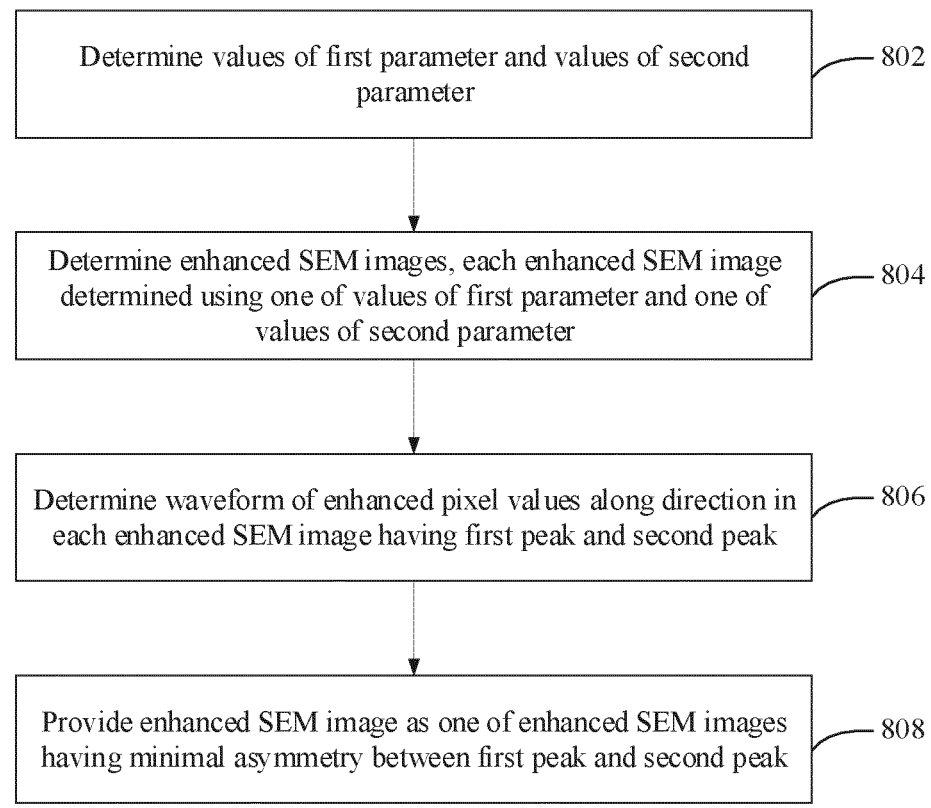
FIG. 8 is a flowchart illustrating an exemplary parameter optimization method for image enhancement, consistent with some embodiments of the present disclosure.
Figure 9:
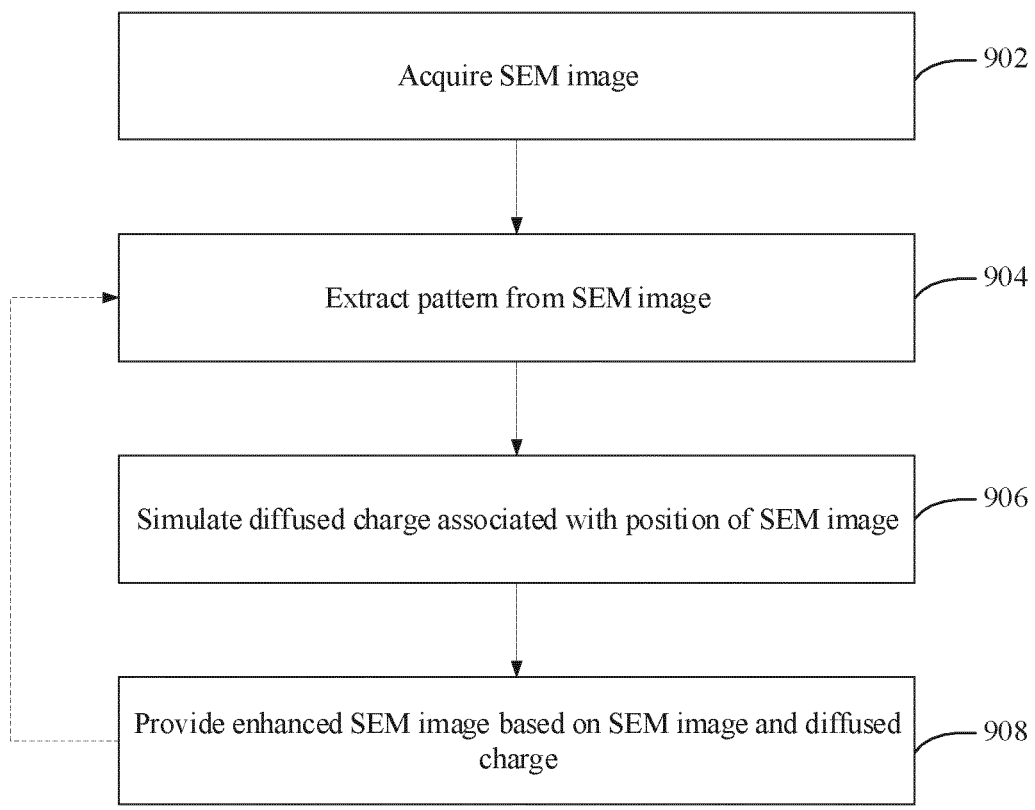
FIG. 9 is a flowchart illustrating an exemplary image enhancement method, consistent with some embodiments of the present disclosure.

FIGS. 7-9 show example methods 700-900 as embodiments of this disclosure. Methods 700-900 may be performed by an image enhancement module that may be coupled with a charged particle beam apparatus (e.g., EBI system 100). For example, a controller (e.g., controller 109 of FIG. 2) may include the image enhancement module and may be programmed to implement methods 700-900. It is appreciated that the charged particle beam apparatus may be controlled to image a wafer or a region of interest on the wafer. Imaging may include scanning the wafer to image a portion of the wafer, which may include scanning the wafer to image the entire wafer. In some embodiments, methods 700-900 may be performed by an image enhancer module (e.g., image enhancer 406 of FIG. 4) or image enhancement system 400.

FIG. 7 is a flowchart illustrating an exemplary image enhancement method 700, consistent with some embodiments of the present disclosure.

At step 702, the controller acquires a scanning electron microscopy (SEM) image. In some embodiments, the controller may acquire the SEM image by scanning a surface of a sample (e.g., insulator sample 304). For example, the controller may receive and process SEM signals collected by an electron detector (e.g., electron detector 206 of FIG. 2) to generate the SEM image. In some embodiments, the controller may acquire the SEM image by receiving it from a database. For example, the database may store one or more SEM images that are generated by the electron detector in previous operations. In some embodiments, the database may also store one or more SEM images that are generated by one or more electron detectors not coupled with the controller, such as an electron detector coupled with another EBI system.

In some embodiments, the SEM image may include a pattern of a structure of the surface of the sample (e.g., insulator sample 304). The pattern may include a SEM-induced charging artifact, which may be a pattern distorted by a SEM-induced charging effect.

At step 704, the controller simulates a diffused charge associated with a position of the SEM image. In some embodiments, the controller may simulate a diffused charge associated with multiple positions of the SEM image. In some embodiments, the controller may prioritize to simulate diffused charge for regions of the SEM image that includes a pattern because SEM-induced charging artifacts tend to occur at those regions. In some embodiments, the position of the SEM image, which the simulated diffused charge is associated with, may be the position of the pattern. For example, after acquiring the SEM image at step 702, the controller may extract a pattern from the SEM image, such as by using an image processing technique for pattern recognition. In some embodiments, the pattern may include a contour, such as a contour of a feature of the surface of the sample. In some embodiments, the pattern may be associated with a height change on the surface of the sample. For example, the pattern may be the pattern in FIG. 5A that includes first and second edges 502 and 504, or the pattern in FIG. 5B that includes first and second edges 506 and 508. Edges 502-508 are associated with a height change on the surface of the sample, such as edges of a slot, a ditch, or a hole.

In some embodiments, to extract the pattern from the SEM image, the controller may determine the pattern as pixels of the SEM image, values of which may satisfy a threshold condition. For example, the threshold condition may be that brightness values of the pixels exceed a predetermined value. For another example, the threshold condition may be that the brightness values of the pixels are below the predetermined value. For another example, the threshold condition may be that the brightness values of the pixels are within a predetermined range. In some embodiments, the threshold condition may be that the pixels are within an edge-bloom region. The controller may determine the edge bloom region using a SEM-image processing technique or other information such as design data (e.g., GDS or GDSII files) of the features of the sample.

Referring back to FIG. 7, at step 706, the controller provides an enhanced SEM image using the SEM image and the diffused charge. In some embodiments, the controller may simulate the diffused charge using different techniques depending on whether the SEM scanning is one-dimensional or two-dimensional at step 704. For example, the one-dimensional SEM scanning may scan a feature in a direction for once, such as for one-dimensional CD inspection, as shown in FIGS. 5A-5B. For another example, the two-dimensional SEM scanning may scan a sample in a raster manner (e.g., line by line) or an individual row-scan manner (e.g., each row is scanned independently), such as for two-dimensional CD inspection, as shown in FIGS. 6A-6I.

When the SEM scanning is one-dimensional, in some embodiments, the controller may simulate the diffused charge associated with the position of the SEM image as follows. In some embodiments, the controller may determine a model to simulate the diffused charge. The model may be based on movement of the diffused charge induced by the SEM-induced charging effect at the position. For example, if the position is at a scanning path of an electron beam (e.g., a primary electron beam) of the SEM, the controller may determine diffused charge based on a diffusing charge distribution and a period of the electron beam illuminating the position. In some embodiments, the diffusing charge distribution may be associated with a diffusion coefficient. In some embodiments, the diffusing charge distribution may be represented by:

$$u_D(x,y,t) \quad \text{Eq. (1)}$$

In Eq. (1), D is the diffusing coefficient (e.g., a constant), x and y represent the position of the scanning path of the electron beam, and t is time. Eq. (1) may describe a one-dimensional diffusion process for different positions of the scanning path at different times. For example, as shown in FIG. 5C, the scanning path of primary electron beam 510 is a horizontal line moving from left to right. Assuming that the horizontal line as an x-axis, horizontal positions of the scanning path may be represented by values of x. Assume a vertical line perpendicular to the x-axis as the y-axis, vertical positions of the scanning path may be represented by values of y. Assume time 0 being when primary electron beam 510 illuminates the left edge of linear feature 512, values of t in Eq. (1) may be counted from the time 0.

The area of the cross-section (or "profile") of the electron beam may be referred to as a "spot size." When the electron beam is illuminating at a position, a region having the same area with the spot size may be illuminated. Because the electron beam is not binarily focused on the surface of the sample, electrons may escape the profile of the electron beam and illuminate surrounding regions outside of the spot size. In other words, the profile of the electron beam has no binary boundary (e.g., a circle), but an attenuating boundary. In some embodiments, such a profile of the electron beam may be described using a two-dimensional Gaussian distribution:

$$g(x, y) = e^{-\frac{x^2+y^2}{2\sigma^2}} \quad \text{Eq. (2)}$$

In Eq. (2), x and y have the same definition as in Eq. (1), and a represents the spot size. In some embodiments, σ may be determined from measurements. In some embodiments, σ may be used as a calibration parameter (e.g., having an assigned value).

In some embodiments, based on Eq. (1) and Eq. (2), a diffusion-based model may be determined for simulating time-independent diffused charge p(x) at a horizontal position x of the SEM image when the SEM scan is one-dimensional:

$$p(x = n\Delta) = \int_{(n-1)T}^{nT} dt dx dy u_D(x, y, t) e^{-\frac{(x-n\Delta)^2+y^2}{2\sigma^2}} \quad \text{Eq. (3)}$$

In Eq. (3), Δ is a pixel size of the SEM image, which represents a unit or granularity of positions of the SEM image. For example, Δ may be the unit length of the horizontal x-axis. n is a pixel number. x=nΔ represents a horizontal position in the SEM image. p(x=nΔ) represents the time-independent diffused charge at the horizontal position x=nΔ. T is a duration of the electron $$g(x - n\Delta, y) = e^{-\frac{(x-n\Delta)^2+y^2}{2\sigma^2}}$$

beam illuminating each pixel. In Eq. (3), represents that the electron beam is illuminating at x=nΔ. When the electron beam scans across the surface of the sample and generate the SEM image, from a perspective of image generation, it may be seen as the electron beam illuminates a region of the surface corresponding to a pixel size Δ of the SEM image for a duration T before proceeding to illuminating the next region corresponding to the next pixel of the SEM image. In other words, the electron beam may scan across a pixel size Δ from time (n−1)T to nT. During the illumination, charge may be deposited in the region and diffuse. Eq. (3) provides an example method to model that charge diffusion by performing the integral, the integral representing the electron beam illuminating at x=nΔ from time (n−1)T to nT and causing charge diffusion in accordance with Eq. (1). By integrating over all possible y values, the integral of Eq. (3) renders the diffused charge to only depend on horizontal positions in the SEM image. In other words, the diffusion model effectively assumes the diffusion of the charge to be one-dimensional (e.g., in x-direction).

In some embodiments, to reduce computation cost, Eq. (1) to (3) may be simplified to be one-dimensional. For example, they may be simplified as follows:

$$u_D(x, t) \quad \text{Eq. (4)}$$

$$g(x) = e^{-\frac{x^2}{2\sigma^2}} \quad \text{Eq. (5)}$$

$$p(x = n\Delta) = \int_{(n-1)T}^{nT} dt dx u_D(x, t) e^{-\frac{(x-n\Delta)^2}{2\sigma^2}} \quad \text{Eq. (6)}$$

In Eqs. (4) to (6), the x-direction may be substantially parallel with a direction of the scanning path of the electron beam. For example, an included angle between the x-direction and the direction of the scanning path may be within a predetermined value (e.g., any value between 0.01 degree to 0.1 degree). The predetermined value may vary depending on actual applications and not limited herein.

In some embodiments, to account for more sophisticated use cases or more complex charging effects, Eq. (1) may be calibrated for edge-bloom regions in the SEM image. Alternatively, Eqs. (1) to (3) may be extended to be three-dimensional. The z-direction may be the direction of depth perpendicular to the surface of the sample and may be used to indicate inside or outside of a concave feature (e.g., a hole, a slot, a ditch, or the like). For example, Eqs. (1) to (3) may be extended as follows:

$$u_D(x, y, z, t) \quad \text{Eq. (7)}$$

$$g(x, y, z) = e^{-\frac{x^2+y^2+z^2}{2\sigma^2}} \quad \text{Eq. (8)}$$

$$p(x = n\Delta) = \int_{(n-1)T}^{nT} dt dx dy dz u_D(x, y, z, t) e^{-\frac{(x-n\Delta)^2+y^2+z^2}{2\sigma^2}} \quad \text{Eq. (9)}$$

If Eqs. (1) to (3) are used for modeling charge diffusion for one-dimensional SEM scanning, correspondingly, the controller may provide the enhanced SEM image using the SEM image and the diffused charge in accordance with a compensation relationship at step 706. In some embodiments, the compensation relationship may be under an assumption that a generated SEM signal is suppressed (e.g., by electron-hole recombination, Coulomb interaction, or both) by the charging effect induced in the vicinity of the electron beam.

In some embodiments, to provide the enhanced SEM image, the controller may determine a corrected pixel value for a pixel of the SEM image by shifting a pixel value of the pixel by a first parameter. The controller may further determine a second parameter as a scaling factor of a product of the corrected pixel value and diffused charge associated with the pixel. The controller may further determine an enhanced pixel value by adding the corrected pixel value and the product scaled by the second parameter. Using the enhanced pixel value, the controller may provide the enhanced SEM image. For example, the controller may use an example compensation relationship $$SEM_c(x) = \frac{SEM_{nc}(x)}{(1+a \cdot p^n(x))^m} - c \quad \text{Eq. (10.1)}$$

In Eq. (10.1), p(x) is the diffused charge determined from Eq. (3). n and m are positive real numbers, such as integers, rational numbers, or irrational numbers. For example, n and m may both be 1. $SEM_c(x)$ represent a SEM image value (e.g., a pixel value) generated at a horizontal position x, which is affected by the SEM-induced charging effect. $SEM_{nc}(x)$ is the sought SEM image value that is not affected by the SEM-induced charging effect. The compensation relationship of Eq. (10.1) may represent that if the charging effect (represented by p(x)) occurs at position x, an amplitude of the actual SEM signal (represented by $SEM_{nc}(x)$) may be suppressed. In some embodiments, $SEM_c(x)$ may be used to generate a SEM image having SEM-induced charging artifacts, and Eq. (10.1) may be used to deduce $SEM_{nc}$ (x), which may be further used to generate the enhanced SEM image that has the charging artifacts compensated (or "decharged").

In Eq. (10.1), a and c are parameters for regression or fitting. In some embodiments, a and c may be scalars. For example, parameter a may be introduced to account for a scaling process that maps a SEM signal into digitized (e.g., 8-bit) pixel values (e.g., grayscale values). Parameter c may be introduced to account for a shift of the minimal value of a SEM signal. For example, the minimal value of the SEM signal is typically adjusted to be 0, as shown in FIGS. 5E-5F. However, in reality, the minimal value of the detected SEM signal is typically non-zero. In those cases, parameter c may adjust the value of such a minimal value to be above 0. It should be noted that c may have a value 0. In some embodiments parameter c may not be used in Eq. (10.1). In Eq. (10.1), n and m may also be parameters for regression or fitting.

By Eq. (10.1), the controller may determine the corrected pixel value for a pixel at position x by shifting the pixel value of the pixel, $SEM_C$ (x), by the first parameter, c. The corrected pixel value may be $SEM_c(x)+c$. The controller may further determine the second parameter a. The product of the corrected pixel value and diffused charge is p(x)·($SEM_c(x)+c$). The controller may further determine the enhanced pixel value $SEM_{nc}(x)$ as $$SEM_{nc}(x)=a \cdot p(x) \cdot (SEM_c(x)+c)+(SEM_c(x)+c) \quad \text{Eq. (11.1)}$$

For another example, the controller may use another example compensation relationship to provide the enhanced SEM image $$SEM_c(x)=SEM_{nc}(x)-a \cdot p^n(x) \quad \text{Eq. (10.2)}$$

In Eq. (10.2), p(x), $SEM_c(x)$ and $SEM_{nc}(x)$ may have the same meaning as in Eq. (10.1). n is a positive real number, such as an integer, a rational number, or an irrational number. For example, n may be 1. In Eq. (10.2), a and n may be parameters for regression or fitting. By Eq. (10.2), the controller may determine the corrected pixel value for a pixel at position x as $SEM_c(x)$ itself (i.e., the pixel shifting is 0). The controller may further determine the first parameter n and the second parameter a. The controller may further determine the enhanced pixel value $SEM_{nc}(x)$ as $$SEM_{nc}(x)=SEM_c(x)+a \cdot p^n(x) \quad \text{Eq. (11.2)}$$

In some embodiments, to determine the enhanced image at step 706, optimal values of the parameters in Eq. (10.1) or (10.2) may be determined. FIG. 8 is a flowchart illustrating an exemplary parameter optimization method 800 for image enhancement, consistent with some embodiments of the present disclosure.

At step 802, the controller determines a set of values of a first parameter and a set of values of a second parameter. For example, by Eq. (10.1), the first parameter may be c, and the second parameter may be a. For another example, by Eq. (10.2), the first parameter may be n, and the second parameter may be a. In some embodiments, the controller may determine sets of values of more than two parameters. For example, by Eq. (10.1), the controller may determine the sets of values of a, c, n, and m.

At step 804, the controller determines a set of enhanced SEM images. In some embodiments, the controller may determine each enhanced SEM image using one of the set of values of the first parameter and one of the set of values of the second parameter. In some embodiments, by Eq. (10.1), the controller may determine a candidate value from a predetermined range for each of a and c. For example, the controller may select candidate values of a between 0.01 to 10 in a step value of 0.01 and candidate values of c between 0.5 to 1.5 in a step value of 0.1. It should be noted that the ranges of candidate values of the first and second parameters may vary and not limited to the provided examples. In some embodiments, the controller may determine each enhanced SEM image using a unique combination of each value of the sets of values of the parameters. For example, by Eq. (10.1), the controller may determine a candidate enhanced SEM image using a unique combination of values of a, c, n, and m.

At step 806, for each of the determined enhanced SEM images, the controller determines a waveform of enhanced pixel values along a direction in each enhanced SEM image. In some embodiments, the direction may be the moving direction of the primary electron beam, such as a direction of a scanning path of the primary electron beam, as shown in FIG. 5C. In some embodiments, the waveform may include a first peak corresponding to a first pattern and a second peak corresponding to a second pattern, and the first pattern and the second pattern is spatially symmetric. For example, the first pattern and the second pattern may be first and second edges in FIG. 5A, and the waveforms may be shown in FIGS. 5E-5F. For example, the controller may use the candidate values determined at step 804 and SEM image values $SEM_{nc}(x)$ for all x to determine each of the enhanced SEM images in accordance with Eq. (11.1).

In some embodiments, the controller may further determine a set of values of a third parameter at step 802, such as the diffusion coefficient D in p(x). The controller may determine candidate values of D between 0.1 to 20 in a step value of 0.1 at step 804, for example. In some embodiments, for each x of the scanning path of the electron beam, the controller may determine a set of diffused charge values by Eq. (3). Each of the diffused charge value may be determined using a different value of the diffusion coefficient D. Based on the set of the diffused charge values, at step 806, the controller may determine the set of enhanced SEM images, each enhanced SEM image determined using one of the set of values of the first parameter, one of the set of values of the second parameter, and one of the set of diffused charge values.

Referring back to FIG. 8, at step 808, the controller provides the enhanced SEM image as one of the set of enhanced SEM images, which has a minimal asymmetry between the first peak and the second peak. In some embodiments, the controller may determine whether each of the waveforms determined at step 806 is symmetric. For example, the waveforms may be plotted, as shown in FIG. 5E. By Eq. (10.1), among all combinations of all candidate values of a, c, and D, the controller may determine an optimal combination that shows minimal asymmetry between the first peak and the second peak (e.g., as shown in FIG. 5F). If such an optimal combination is found, the controller may determine the enhanced SEM image as such a SEM image that has minimal asymmetry. In some embodiments, if more than one optimal combination of parameter values is found, the controller may further determine a final optimal combination by considering other KPIs of the inspection, such as a confidence level of CD estimation from the SEM image.

When the SEM scanning is two-dimensional, in some embodiments, the controller may simulate the diffused charge associated with the position of the SEM image as follows. In some embodiments, the controller may determine a model to simulate the diffused charge associated with the position of the SEM image. The model may be based on a charge density of the diffused charge induced by the SEM-induced charging effect at the position and a weighting of the charge density. For a set of positions of the SEM image, the controller may determine charge density values associated with the positions and weight values associated with the positions. The controller may further determine the diffused charge at a position of the positions by performing a convolution of the charge density values and the weight values at the position. In some embodiments, the controller may determine a charge density value and a weight value for each pixel of the SEM image. In some embodiments, the charge density values may be binary. For example, the charge density values associated with the positions may be the charge density mask, as described in FIG. 6D and its associated paragraphs. The weight values associated with the positions may be referred to as a weight function. The weight function is introduced to a two-dimensional diffusion-based model to account for the asymmetry introduced by the directional SEM scanning, which will be described as follows.

In some embodiments, a two-dimensional diffusion-based model may be determined for simulating time-independent diffused charge c(x,y) at a position (x,y) (e.g., as shown in x-y coordinates in FIGS. 6A-6I) of the SEM image when the SEM scan is two-dimensional. For example, the two-dimensional diffusion-based model may be determined as a convolution of the charge density mask and the weight function:

$$c(x,y) = cdm(x,y) \otimes w(x,y) \qquad \text{Eq. (12)}$$

In Eq. (12), c(x,y) represents time-independent diffused charge at position (x, y) of a SEM image, which may be functionally similar to p(x) in Eq. (10.1) or (10.2). cdm(x, y) represents the charge density mask, and w(x, y) represents the weight function. The symbol $\otimes$ represents a two-dimensional convolution. For example, the convolution may be $$cdm(x,y) \otimes w(x,y) = \iint cdm(t,u)w(x-t,y-u)dtdu \qquad \text{Eq. (13)}$$

In Eq. (13), the integral range of t and u may be the ranges of x and y in the SEM image, respectively. One physical nature of SEM scanning is that the electron beam of the SEM scans across the surface of the sample in a direction. As shown in FIG. 5D, the charge diffusion caused by the electron beam is asymmetric in front of or behind the moving electron beam. To account for such asymmetry in Eqs. (12) and (13), in some embodiments, w(x, y) may be a two-dimensional Gaussian distribution $$w(x, y) = \begin{cases} \exp\left(-\frac{(x-x_0)^2}{2\sigma_x^2} - \frac{(y-y_0)^2}{2\sigma_y^2}\right), & x \geq 0, y \geq 0 \\ 0, & \text{otherwise} \end{cases} \qquad \text{Eq. (14)}$$

In Eq. (14), $x_0$ and $y_0$ may be any coordinate value in the SEM image. In some embodiments, $x_0$ and $y_0$ may both be 0. The effect of convolving cdm(x, y) with w(x, y) may be that cdm(x, y) may be directionally blurred, as shown and described in FIGS. 6E-6F and their associated paragraphs. In some other embodiments, w(x, y) may be a two-dimensional Lorentzian distribution $$w(x, y) = \begin{cases} \dfrac{\sigma_x^{2n}}{(x-x_0)^{2n} + \sigma_x^{2n}} \cdot \dfrac{\sigma_y^{2n}}{(y-y_0)^{2n} + \sigma_y^{2n}}, & x \geq 0, y \geq 0 \\ 0, & \text{otherwise} \end{cases} \qquad \text{Eq. (15)}$$

In Eq. (15), n represents a positive integer or a positive fractional. $x_0$ and $y_0$ may be any coordinate value in the SEM image. In some embodiments, $x_0$ and $y_0$ may both be 0. Eq. (14) and Eq. (15) may achieve similar directional blur for cdm(x, y). It should be noted that any decaying or decreasing function may be used in Eq. (14) and (15), not limited to the example Gaussian or Lorentzian distributions.

It should also be noted that, in Eqs. (14) and (15), $\sigma_x$ and $\sigma_y$ may be analogues of D in Eq. (3). In some embodiments, $\sigma_x$ and $\sigma_y$ may be parameters for regression or fitting. It should also be noted that, Eqs. (14) and (15) describe w(x, y) suitable for horizontal scans. When the SEM image is obtained from oblique scans (e.g., primary electron beam 510 scans across linear feature 512 at an angle, such as 45°), the x-y plane of w(x, y) in Eqs. (14) and (15) may also be rotated accordingly. For example, such rotation may be implemented by performing Cartesian axis rotation.

In modeling charge diffusion for two-dimensional SEM scanning, correspondingly, the controller may provide the enhanced SEM image using the SEM image and the diffused charge by a compensation relationship at step 706. In some embodiments, the compensation relationship may be under an assumption that a generated SEM signal is suppressed (e.g., by electron-hole recombination, Coulomb interaction, or both) by the charging effect induced in the vicinity of the electron beam.

In some embodiments, for a set of positions of the SEM image, the controller may further determine beam-profile values of the electron beam at the set of positions when the electron beam illuminates at the position. For example, the set of positions may be near or surrounding the position where the electron beam illuminates. The controller may further determine the diffused charge at the position by performing a convolution of the charge density values, the weight values, and the beam-profile values at the position. Similar to Eq. (3), to estimate additional blur introduced by the beam profile, c(x,y) in Eq. (12) may be further convolved with a beam profile function, such as g(x,y) Eq. (2):

$$c(x,y)=cdm(x,y)\otimes w(x,y)\otimes g(x,y) \qquad \text{Eq. (16)}$$

In some embodiments, to account for more sophisticated use cases or more complex charging effects, Eq. (12) to (16) may be extended to be three-dimensional. The z-direction may be the direction of depth perpendicular to the surface of the sample and may be used to indicate inside or outside of a concave feature (e.g., a hole, a slot, a ditch, or the like).

In some embodiments, to provide the enhanced SEM image, the controller may adjust a pixel value of the SEM image at the position to reduce the SEM-induced charging artifact based on one of the aforementioned models. In some embodiments, the controller may determine a corrected pixel value for a pixel of the SEM image by shifting a pixel value of the pixel by a first parameter. The controller may further determine a second parameter as a scaling factor of a product of the corrected pixel value and diffused charge associated with the pixel. The controller may further determine an enhanced pixel value by adding the corrected pixel value and the product scaled by the second parameter. Using the enhanced pixel value, the controller may provide the enhanced SEM image. For example, the controller may use an example compensation relationship $$SE_c(x, y) = \frac{SE_{nc}(x, y)}{(1 + a \cdot c^n(x, y))^m} - c \qquad \text{Eq. (17.1)}$$

In Eq. (17.1), n and m are positive real numbers, such as integers, rational numbers, or irrational numbers. For example, n and m may both be 1. $SE_c(x, y)$ represents a SEM image value (e.g., a pixel value) generated at the position (x, y), which is affected by the SEM-induced charging artifacts. $SE_{nc}(x,y)$ is the sought SEM image value that is not affected by the SEM-induced charging artifacts. The compensation relationship of Eq. (17.1) may represent that if the charging effect (represented by cdm(x, y)⊗w(x, y)) occurs at position (x, y), an image value of the actual SEM image (represented by $SE_{nc}(x,y)$) may be suppressed. In other words, Eq. (17.1) may be used to deduce $SE_{nc}(x,y)$. In Eq. (17.1), parameters a and c function similarly as in Eq. (10.1). In those cases, parameter c may adjust the value of such a minimal value to be above 0. It should be noted that c may have a value 0. In some embodiments, parameter c may not be used in Eq. (17.1). In Eq. (17.1), n and m may also be parameters for regression or fitting.

By Eq. (17.1), the controller may determine the corrected pixel value for a pixel at position x by shifting the pixel value of the pixel, $SE_c(x, y)$, by the first parameter, c. The corrected pixel value may be $SE_c(x,y)+c$. The controller may further determine the second parameter a. The product of the corrected pixel value and diffused charge is $c(x,y) \cdot (SE_c(x,y)+c)$. The controller may further determine the enhanced pixel value $SE_{nc}(x,y)$ as $$SE_{nc}(x,y) = a \cdot c(x,y) \cdot (SE_c(x,y)+c)+(SE_c(x,y)+c) \qquad \text{Eq. (18.1)}$$

For another example, the controller may use another example compensation relationship to provide the enhanced SEM image $$SE_c(x)=SE_{nc}(x)-a \cdot c^n(x,y) \qquad \text{Eq. (17.2)}$$

In Eq. (17.2), c(x,y), $SE_c(x)$ and $SE_{nc}(x)$ may have the same meaning as in Eq. (17.1). n is a positive real number, such as an integer, a rational number, or an irrational number. For example, n may be 1. In Eq. (17.2), a and n may be parameters for regression or fitting. By Eq. (17.2), the controller may determine the corrected pixel value for a pixel at position x as $SE_c(x)$ itself (i.e., the pixel shifting is 0). The controller may further determine the first parameter n and the second parameter a. The controller may further determine the enhanced pixel value $SE_{nc}$ (x) as $$SE_{nc}(x)=SE_c(x)+a \cdot c^n(x,y) \qquad \text{Eq. (18.2)}$$

In some embodiments, to determine the enhanced image at step 706, the controller may determine optimal values of the parameters in Eq. (17.1) or (17.2) by method 800. For example, at step 802, by Eq. (17.1), the controller may determine a set of values of the first parameter c and a set of values of the second parameter a. At step 804, the controller determines a set of enhanced SEM images as previously described.

At step 806, for each of the determined enhanced SEM images, the controller determines a waveform of enhanced pixel values along a direction in the each enhanced SEM image. In some embodiments, the direction may be any moving direction of the primary electron beam. For example, as shown in FIGS. 6H-6I, there are 3 horizontal and 3 vertical white dashed lines. The white dash lines may represent moving directions of the primary electron beam at different times. By scanning along the white dash lines, the controller may determine waveforms representing possible SEM-induced charging artifacts. For example, 1D waveforms (shown as white waveforms near the white dash lines) determined by the controller for FIGS. 6H-6I are superimposed on top of the 2D figures. In some embodiments, the waveform may include a first peak corresponding to a first pattern and a second peak corresponding to a second pattern, and the first pattern and the second pattern is spatially symmetric. For example, the first peak and the second peak may be SEM signal peaks 630 and 632 in FIG. 6H, respectively. SEM signal peaks 630 and 632 are near the middle horizontal white dash line in FIG. 6H. The first pattern and the second pattern may be the edges of the hole superimposed by SEM signal peaks 630 and 632, respectively. At step 806, for example, the controller may use the candidate values determined at step 804 and SEM image values $SE_{nc}(x, y)$ for all (x,y) to determine each of the enhanced SEM images in accordance with Eq. (18.1).

At step 808, the controller provides the enhanced SEM image as one of the set of enhanced SEM images, which has a minimal asymmetry between the first peak and the second peak. For example, among all combinations of all candidate values of a and c, the controller may determine an optimal combination that shows minimal asymmetry between the first peak and the second peak. For example, FIG. 6I shows such a SEM image that has a minimal asymmetry between SEM signal peaks 634 and 636. If such an optimal combination is found, the controller may determine the enhanced SEM image as such a SEM image that has minimal asymmetry.

In some embodiments, to account for SEM-inducing charging effects at different horizontal cross-sections of the surface of the sample, the controller may determine the charge density values as associated with heights of the positions on the surface of the sample. For example, the controller may determine c(x,y) in Eq. (12) associated with a set of height masks, such as the height mask as shown and described in FIG. 6C and its associated paragraphs. The height masks may have different heights for their horizontal cross-sections. In some embodiments, each height mask may have its corresponding optimal combination of parameters, such as a, c, n, and m in Eqs. (10.1) or (17.1), or a and n in Eqs. (10.2) or (17.2). In other words, the enhanced SEM image for each of the height mask may be different.

In some embodiments, the controller may determine a final optimal combination of parameters from one of the optimal combinations of parameters of the height masks. For example, the controller may compare SEM signal symmetry (e.g., as shown in FIGS. 6H-6I) between the enhanced SEM images of the height masks. The controller may then determine a final enhanced image as one of the enhanced SEM images, which has the minimum SEM signal asymmetry.

FIG. 9 is a flowchart illustrating an exemplary image enhancement method 900, consistent with some embodiments of the present disclosure.

At step 902, the controller acquires a SEM image. Step 902 may be implemented like step 702.

At step 904, the controller extracts a pattern from the SEM image. Pattern extraction at step 904 may be implemented like the description at step 704. In some embodiments, the controller may use an image processing technique for the pattern extraction. In some embodiments, if a pattern is heavily distorted by SEM-induced charging effect, the controller may use an iterative approach for pattern extraction and SEM image compensation. By the iterative approach, the controller may extract the pattern at step 904 and enhance the SEM image at following steps 906-908. The controller may then extract a pattern again using the enhanced SEM image, which is shown as a dashed arrow between steps 908 and 904 in FIG. 9. The controller may repeat steps 904-908 until the pattern is extracted to a predetermined level of confidence.

At step 906, the controller simulates diffused charge associated with a position of the SEM image. Step 906 may be implemented like step 704. For example, the controller may determine the diffused charge by Eq. (3), (12), or (16).

At step 908, the controller provides an enhanced SEM image based on the SEM image and the diffused charge correlated by a compensation relationship. Step 908 may be implemented like step 706. For example, the compensation relationship may be Eq. (10.1), (10.2), (17.1), or (17.2). The controller may determine multiple values for parameters in Eq. (10.1), (10.2), (17.1), and (17.2), such as parameters a, c, n, m, and D in Eq. (10.1), parameters a, n, and D in Eq. (10.2), parameters a, c, n, m, $\sigma_x$, and $\sigma_y$ in Eq. (17.1), or parameters a, n, $\sigma_x$, and $\sigma_y$ in Eq. (17.2). Using different combinations of the values of the parameter, the controller may determine enhanced pixel values for pixels of the SEM image. For example, the enhanced pixel values may be determined by Eq. (11.1), (11.2), (18.1), or (18.2). Using the enhanced pixel values, the controller may provide the enhanced SEM image, such as by implementing method 800.

The embodiments may further be described using the following clauses:

1. A method for enhancing an image, the method comprising:
    acquiring a scanning electron microscopy (SEM) image;
    simulating diffused charge associated with a position of the SEM image; and
    providing an enhanced SEM image based on the SEM image and the diffused charge.
2. The method of clause 1, wherein acquiring the SEM image comprises:
    acquiring the SEM image by scanning a surface of a sample.
3. The method of clause 1, wherein acquiring the SEM image comprises:
    receiving the SEM image from a database.
4. The method of any one of preceding clauses, wherein the SEM image comprises a pattern of a structure at the position of the SEM image, and the pattern comprises a SEM-induced charging artifact.
5. The method of any one of preceding clauses, further comprising:
    after acquiring the SEM image, extracting a pattern from the SEM image.
6. The method of clause 5, wherein the pattern comprises a contour.
7. The method of any one of clauses 5 to 6, wherein the pattern is associated with a height change on the surface of the sample.
8. The method of any one of clauses 5 to 7, wherein extracting the pattern from the SEM image comprises:
    determining the pattern as pixels of the SEM image, wherein pixel values of the pixels satisfy a threshold condition.
9. The method of any one of preceding clauses, wherein simulating the diffused charge associated with the position of the SEM image comprises:
    determining a first model, wherein the first model is based on movement of the diffused charge induced by a SEM-induced charging effect at the position.
10. The method of any one of preceding clauses, wherein simulating the diffused charge associated with the position of the SEM image comprises:
    determining diffused charge based on a diffusing charge distribution and a duration of the electron beam illuminating the position, wherein the position is in a scanning path of an electron beam of the SEM, and the diffusing charge distribution is associated with a diffusion coefficient.
11. The method of clause 10, wherein the diffusing charge distribution is one of a one-dimensional diffusing charge distribution, a two-dimensional diffusing charge distribution, or a three-dimensional diffusing charge distribution.

12. The method of clause 11, wherein a dimension of the one-dimensional diffusing charge distribution is substantially parallel with a direction of the scanning path.

13. The method of any one of clauses 1 to 8, wherein simulating the diffused charge associated with the position of the SEM image comprises:
   determining a second model, wherein the second model is based on a charge density of the diffused charge induced by a SEM-induced charging effect at the position and a weighting of the charge density.

14. The method of any one of clauses 1 to 8, wherein simulating the diffused charge associated with the position of the SEM image comprises:
   determining, for a set of positions of the SEM image, charge density values and weight values associated with the set of positions; and
   determining the diffused charge at the position by performing a convolution of the charge density values and the weight values at the position.

15. The method of clause 14, wherein simulating the diffused charge associated with the position of the SEM image comprises:
   determining, for the set of positions of the SEM image, beam-profile values of the electron beam at the set of positions when the electron beam illuminates at the position; and
   determining the diffused charge at the position by performing a convolution of the charge density values, the weight values, and the percentage values at the position.

16. The method of any one of clauses 14 to 15, wherein the charge density values are binary.

17. The method of any one of clauses 14 to 16, wherein the charge density values are associated with heights of the set of positions on the surface of the sample.

18. The method of any one of clauses 14 to 17, wherein the weight values are in a two-dimensional Gaussian distribution.

19. The method of any one of clauses 14 to 18, wherein the weight values are in a two-dimensional Lorentzian distribution.

20. The method of any one of clauses 9 to 19, wherein providing the enhanced SEM image using the SEM image and the diffused charge comprises:
   providing the enhanced SEM image by adjusting a pixel value of the SEM image at the position to reduce the SEM-induced charging artifact based on one of the first model or the second model.

21. The method of any one of preceding clauses, wherein providing the enhanced SEM image using the SEM image and the diffused charge comprises:
   determining, for a pixel of the SEM image, a corrected pixel value by shifting a pixel value of the pixel by a first parameter, a second parameter as a scaling factor of a product of the corrected pixel value and diffused charge associated with the pixel, and an enhanced pixel value by adding the corrected pixel value and the product scaled by the second parameter; and
   providing the enhanced SEM image using the enhanced pixel value.

22. The method of clause 21, wherein providing the enhanced SEM image using the SEM image and the diffused charge comprises:
   determining a set of values of the first parameter and a set of values of the second parameter;
   determining a set of enhanced SEM images, wherein each enhanced SEM image is determined using one of the set of values of the first parameter and one of the set of values of the second parameter;
   determining, for the each enhanced SEM images, a waveform of enhanced pixel values along a direction in the each enhanced SEM image, wherein the waveform comprises a first peak corresponding to a first pattern and a second peak corresponding to a second pattern, and the first pattern and the second pattern is spatially symmetric; and
   providing the enhanced SEM image as one of the set of enhanced SEM images having minimal asymmetry between the first peak and the second peak.

23. The method of clause 22, wherein providing the enhanced SEM image using the SEM image and the diffused charge further comprises:
   determining a set of diffused charge values based on the diffusing charge distribution and the duration of the electron beam illuminating the position, wherein the position is in the scanning path of the electron beam, and the diffusing charge distribution is associated with a set of diffusion coefficients; and
   determining the set of enhanced SEM images, wherein the each enhanced SEM image is determined using one of the set of values of the first parameter, one of the set of values of the second parameter, and one of the set of diffused charge values.

24. An inspection system, comprising:
   a memory storing a set of instructions; and
   a processor configured to execute the set of instructions to cause the inspection system to:
     acquire a scanning electron microscopy (SEM) image;
     simulate diffused charge associated with a position of the SEM image; and
     provide an enhanced SEM image based on the SEM image and the diffused charge.

25. The inspection system of clause 24, wherein the set of instructions to cause the inspection system to acquire the SEM image further causes the inspection system to:
   acquire the SEM image by scanning a surface of a sample.

26. The inspection system of clause 24, wherein the set of instructions to cause the inspection system to acquire the SEM image further causes the inspection system to:
   receive the SEM image from a database.

27. The inspection system of any one of clauses 24 to 26, wherein the SEM image comprises a pattern of a structure of a surface of a sample, and the pattern comprises a SEM-induced charging artifact.

28. The inspection system of any one of clauses 24 to 27, wherein the set of instructions further cause the inspection system to:
   after acquiring the SEM image, extract a pattern from the SEM image.

29. The inspection system of clause 28, wherein the pattern comprises a contour.

30. The inspection system of any one of clauses 28 to 29, wherein the pattern is associated with a height change on the surface of the sample.

31. The inspection system of any one of clauses 28 to 30, wherein the set of instructions to cause the inspection system to extract the pattern from the SEM image further causes the inspection system to:

determine the pattern as pixels of the SEM image, wherein pixel values of the pixels satisfy a threshold condition.

32. The inspection system of any one of clauses 24 to 31, wherein the set of instructions to cause the inspection system to simulate the diffused charge associated with the position of the SEM image further causes the inspection system to:
determine a first model, wherein the first model is based on movement of the diffused charge induced by a SEM-induced charging effect at the position.

33. The inspection system of any one of clauses 24 to 32, wherein the set of instructions to cause the inspection system to simulate the diffused charge associated with the position of the SEM image further causes the inspection system to:
determine diffused charge based on a diffusing charge distribution and a duration of the electron beam illuminating the position, wherein the position is in a scanning path of an electron beam of the SEM, and the diffusing charge distribution is associated with a diffusion coefficient.

34. The inspection system of clause 33, wherein the diffusing charge distribution is one of a one-dimensional diffusing charge distribution, a two-dimensional diffusing charge distribution, or a three-dimensional diffusing charge distribution.

35. The inspection system of clause 34, wherein a dimension of the one-dimensional diffusing charge distribution is substantially parallel with direction of the scanning path.

36. The inspection system of any one of clauses 24 to 31, wherein the set of instructions to cause the inspection system to simulate the diffused charge associated with the position of the SEM image further causes the inspection system to:
determine a second model, wherein the second model is based on a charge density of the diffused charge induced by a SEM-induced charging effect at the position and a weighting of the charge density.

37. The inspection system of any one of clauses 24 to 31, wherein the set of instructions to cause the inspection system to simulate the diffused charge associated with the position of the SEM image further causes the inspection system to:
determine, for a set of positions of the SEM image, charge density values and weight values associated with the set of positions; and
determine the diffused charge at the position by performing a convolution of the charge density values and the weight values at the position.

38. The inspection system of clause 37, wherein the set of instructions to cause the inspection system to simulate the diffused charge associated with the position of the SEM image further causes the inspection system to:
determine, for the set of positions of the SEM image, beam-profile values of the electron beam at the set of positions when the electron beam illuminates at the position; and
determine the diffused charge at the position by performing a convolution of the charge density values, the weight values, and the percentage values at the position.

39. The inspection system of any one of clauses 37 to 38, wherein the charge density values are binary.

40. The inspection system of any one of clauses 37 to 39, wherein the charge density values are associated with heights of the set of positions on the surface of the sample.

41. The inspection system of any one of clauses 37 to 40, wherein the weight values are in a two-dimensional Gaussian distribution.

42. The inspection system of any one of clauses 37 to 41, wherein the weight values are in a two-dimensional Lorentzian distribution.

43. The inspection system of any one of clauses 32 to 42, wherein the set of instructions to cause the inspection system to provide the enhanced SEM image using the SEM image and the diffused charge further causes the inspection system to:
provide the enhanced SEM image by adjusting a pixel value of the SEM image at the position to reduce the SEM-induced charging artifact based on one of the first model or the second model.

44. The inspection system of any one of clauses 24 to 43, wherein the set of instructions to cause the inspection system to provide the enhanced SEM image using the SEM image and the diffused charge further causes the inspection system to:
determine, for a pixel of the SEM image, a corrected pixel value by shifting a pixel value of the pixel by a first parameter, a second parameter as a scaling factor of a product of the corrected pixel value and diffused charge associated with the pixel, and an enhanced pixel value by adding the corrected pixel value and the product scaled by the second parameter; and
provide the enhanced SEM image using the enhanced pixel value.

45. The inspection system of clause 44, wherein the set of instructions to cause the inspection system to provide the enhanced SEM image using the SEM image and the diffused charge further causes the inspection system to:
determine a set of values of the first parameter and a set of values of the second parameter;
determine a set of enhanced SEM images, wherein each enhanced SEM image is determined using one of the set of values of the first parameter and one of the set of values of the second parameter;
determine, for the each enhanced SEM images, a waveform of enhanced pixel values along a direction in the each enhanced SEM image, wherein the waveform comprises a first peak corresponding to a first pattern and a second peak corresponding to a second pattern, and the first pattern and the second pattern is spatially symmetric; and
provide the enhanced SEM image as one of the set of enhanced SEM images having minimal asymmetry between the first peak and the second peak.

46. The inspection system of clause 45, wherein the set of instructions to cause the inspection system to provide the enhanced SEM image using the SEM image and the diffused charge further causes the inspection system to:
determine a set of diffused charge values based on the diffusing charge distribution and the duration of the electron beam illuminating the position, wherein the position is in the scanning path of the electron beam, and the diffusing charge distribution is associated with a set of diffusion coefficients; and
determine the set of enhanced SEM images, wherein the each enhanced SEM image is determined using one of the set of values of the first parameter, one of the set of values of the second parameter, and one of the set of diffused charge values.

47. A non-transitory computer readable medium that stores a set of instructions that is executable by at least one processor of an apparatus to cause the apparatus to perform a method for enhancing an image, the method comprising:
acquiring a scanning electron microscopy (SEM) image;
simulating diffused charge associated with position of the SEM image; and
providing an enhanced SEM image based on the SEM image and the diffused charge.

48. The non-transitory computer readable medium of clause 47, wherein acquiring the SEM image comprises:
acquiring the SEM image by scanning a surface of a sample.

49. The non-transitory computer readable medium of clause 47, wherein acquiring the SEM image comprises:
receiving the SEM image from a database.

50. The non-transitory computer readable medium of any one of clauses 47 to 49, wherein the SEM image comprises a pattern of a structure of a surface of a sample, and the pattern comprises a SEM-induced charging artifact.

51. The non-transitory computer readable medium of any one of clauses 47 to 48, wherein the method further comprises:
after acquiring the SEM image, extracting a pattern from the SEM image.

52. The non-transitory computer readable medium of clause 51, wherein the pattern comprises a contour.

53. The non-transitory computer readable medium of any one of clauses 51 to 52, wherein the pattern is associated with a height change on the surface of the sample.

54. The non-transitory computer readable medium of any one of clauses 51 to 53, wherein extracting the pattern from the SEM image comprises:
determining the pattern as pixels of the SEM image, wherein pixel values of the pixels satisfy a threshold condition.

55. The non-transitory computer readable medium of any one of clauses 47 to 54, wherein simulating the diffused charge associated with the position of the SEM image comprises:
determining a first model, wherein the first model is based on movement of the diffused charge induced by a SEM-induced charging effect at the position.

56. The non-transitory computer readable medium of any one of clauses 47 to 55, wherein simulating the diffused charge associated with the position of the SEM image comprises:
determining diffused charge based on a diffusing charge distribution and a duration of the electron beam illuminating the position, wherein the position is in a scanning path of an electron beam of the SEM, and the diffusing charge distribution is associated with a diffusion coefficient.

57. The non-transitory computer readable medium of clause 56, wherein the diffusing charge distribution is one of a one-dimensional diffusing charge distribution, a two-dimensional diffusing charge distribution, or a three-dimensional diffusing charge distribution.

58. The non-transitory computer readable medium of clause 57, wherein a dimension of the one-dimensional diffusing charge distribution is substantially parallel with direction of the scanning path.

59. The non-transitory computer readable medium of any one of clauses 47 to 54, wherein simulating the diffused charge associated with the position of the SEM image comprises:
determining a second model, wherein the second model is based on a charge density of the diffused charge induced by a SEM-induced charging effect at the position and a weighting of the charge density.

60. The non-transitory computer readable medium of any one of clauses 47 to 54, wherein simulating the diffused charge associated with the position of the SEM image comprises:
determining, for a set of positions of the SEM image, charge density values and weight values associated with the a set of positions; and
determining the diffused charge at the position by performing a convolution of the charge density values and the weight values at the position.

61. The non-transitory computer readable medium of clause 60, wherein simulating the diffused charge associated with the position of the SEM image comprises:
determining, for the set of positions of the SEM image, beam-profile values of the electron beam at the set of positions when the electron beam illuminates at the position; and
determining the diffused charge at the position by performing a convolution of the charge density values, the weight values, and the percentage values at the position.

62. The non-transitory computer readable medium of any one of clauses 60 to 61, wherein the charge density values are binary.

63. The non-transitory computer readable medium of any one of clauses 60 to 62, wherein the charge density values are associated with heights of the set of positions on the surface of the sample.

64. The non-transitory computer readable medium of any one of clauses 60 to 63, wherein the weight values are in a two-dimensional Gaussian distribution.

65. The non-transitory computer readable medium of any one of clauses 60 to 64, wherein the weight values are in a two-dimensional Lorentzian distribution.

66. The non-transitory computer readable medium of any one of clauses 47 to 65, wherein providing the enhanced SEM image using the SEM image and the diffused charge comprises:
providing the enhanced SEM image by adjusting a pixel value of the SEM image at the position to reduce the SEM-induced charging artifact based on one of the first model or the second model.

67. The non-transitory computer readable medium of any one of clauses 47 to 66, wherein providing the enhanced SEM image using the SEM image and the diffused charge comprises:
determining, for a pixel of the SEM image, a corrected pixel value by shifting a pixel value of the pixel by a first parameter, a second parameter as a scaling factor of a product of the corrected pixel value and diffused charge associated with the pixel, and an enhanced pixel value by adding the corrected pixel value and the product scaled by the second parameter; and
providing the enhanced SEM image using the enhanced pixel value.

68. The non-transitory computer readable medium of clause 67, wherein providing the enhanced SEM image using the SEM image and the diffused charge comprises:
  determining a set of values of the first parameter and a set of values of the second parameter;
  determining a set of enhanced SEM images, wherein each enhanced SEM image is determined using one of the set of values of the first parameter and one of the set of values of the second parameter;
  determining, for the each enhanced SEM images, a waveform of enhanced pixel values along a direction in the each enhanced SEM image, wherein the waveform comprises a first peak corresponding to a first pattern and a second peak corresponding to a second pattern, and the first pattern and the second pattern is spatially symmetric; and
  providing the enhanced SEM image as one of the set of enhanced SEM images having minimal asymmetry between the first peak and the second peak.

69. The non-transitory computer readable medium of clause 68, wherein providing the enhanced SEM image using the SEM image and the diffused charge further comprises:
  determining a set of diffused charge values based on the diffusing charge distribution and the duration of the electron beam illuminating the position, wherein the position is in the scanning path of the electron beam, and the diffusing charge distribution is associated with a set of diffusion coefficients; and
  determining the set of enhanced SEM images, wherein the each enhanced SEM image is determined using one of the set of values of the first parameter, one of the set of values of the second parameter, and one of the set of diffused charge values.

A non-transitory computer readable medium may be provided that stores instructions for a processor (for example, processor of controller 109 of FIG. 1) to carry out image processing, data processing, database management, graphical display, operations of a charged particle beam apparatus, or another imaging device, or the like. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

The block diagrams in the figures illustrate the architecture, functionality, and operation of possible implementations of systems, methods, and computer hardware or software products according to various exemplary embodiments of the present disclosure. In this regard, each block in a flowchart or block diagram may represent a module, segment, or portion of code, which includes one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes may be made without departing from the scope thereof.

The invention claimed is:

1. A method for enhancing an image, the method comprising:
  acquiring a scanning electron microscopy (SEM) image of a sample;
  simulating a SEM-induced charging effect associated with a position of the SEM image, wherein the simulated SEM-induced charging effect comprises a simulated diffused charge accumulated on or near a surface of the sample induced by an electron beam scanning over the surface of the sample; and
  providing an enhanced SEM image based on the SEM image and the simulated SEM-induced charging effect.

2. The method of claim 1, wherein acquiring the SEM image comprises:
  acquiring the SEM image by scanning a surface of a sample.

3. The method of claim 1, wherein acquiring the SEM image comprises:
  receiving the SEM image from a database.

4. The method of claim 1, wherein the SEM image comprises a pattern of a structure at the position of the SEM image, and the pattern comprises a SEM-induced charging artifact.

5. The method of claim 1, further comprising:
  after acquiring the SEM image, extracting a pattern from the SEM image.

6. The method of claim 5, wherein a pattern comprises a contour.

7. The method of claim 5, wherein the pattern is associated with a height change on the surface of the sample.

8. The method of claim 5, wherein extracting the pattern from the SEM image comprises:
  extracting the pattern as pixels of the SEM image, wherein pixel values of the pixels satisfy a threshold condition, and wherein the threshold condition comprises a pixel brightness value above or below a predetermined value or within a predetermined range, or a pixel location within an edge bloom region.

9. The method of claim 1, wherein simulating the SEM-induced charging effect associated with the position of the SEM image comprises:
  determining a first model, wherein the first model is based on movement of the diffused charged induced by the SEM-induced charging effect at the position; and
  applying the first model to the SEM image to simulate the SEM-induced charging effect.

10. The method of claim 1, wherein simulating the SEM-induced charging effect associated with the position of the SEM image comprises:
  simulating the diffused charged based on a diffusing charge distribution and a duration of the electron beam illuminating the position, wherein the position is in a scanning path of the electron beam of the SEM, and the diffusing charged distribution comprises a diffusion coefficient.

11. The method of claim 10, wherein the diffusing charge distribution is one of a one-dimensional diffusing charge distribution, a two-dimensional diffusing charged distribution, or a three-dimensional diffusing charge distribution.

12. The method of claim 11, wherein a dimension of the one-dimensional diffusing charged distribution is substantially parallel with a direction of the scanning path.

13. The method of claim 1, wherein simulating the SEM-induced charging effect associated with the position of the SEM image comprises:
   determining a second model, wherein the second model is based on a charge density of the diffused charge induced by the SEM-induced charging effect at the position and a weighting of the charged density; and
   applying the second model to the SEM image to simulate the SEM-induced charging effect.

14. The method of claim 1, wherein simulating the SEM-induced charging effect associated with the position of the SEM image comprises:
   determining, for a set of positions of the SEM image, charge density values and weight values associated with the set of positions; and
   simulating the diffused charge at the position by performing a convolution of the charge density values and the weight values at the position.

15. An inspection system, comprising:
   a memory storing a set of instructions; and
   a processor configured to execute the set of instructions to cause the inspection system to:
      acquire a scanning electron microscopy (SEM) image of a sample;
      simulate a SEM-induced charging effect associated with a position of the SEM image, wherein the simulated SEM-induced charging effect comprises a simulated diffused charge accumulated on or near a surface of the sample induced by an electron beam scanning over the surface of the sample; and
      provide an enhanced SEM image based on the SEM image and the simulated SEM-induced charging effect.

* * * * *